(12) United States Patent
Shirahata et al.

(10) Patent No.: US 6,461,920 B1
(45) Date of Patent: Oct. 8, 2002

(54) SEMICONDUCTOR DEVICE AND METHOD OF MANUFACTURING THE SAME

(75) Inventors: Masayoshi Shirahata, Hyogo (JP); Yoshinori Okumura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 51 days.

(21) Appl. No.: 09/654,877

(22) Filed: Sep. 5, 2000

Related U.S. Application Data

(62) Division of application No. 08/725,386, filed on Oct. 3, 1996, now Pat. No. 6,144,079.

(30) Foreign Application Priority Data

Apr. 1, 1996 (JP) ................................. 8-78912

(51) Int. Cl.[7] .................. H01L 21/8236; H01L 21/336; H01L 21/8238
(52) U.S. Cl. ...................... 438/276; 438/289; 438/291; 438/224; 438/228
(58) Field of Search ................................. 438/223, 224, 438/227, 228, 289, 291, 276

(56) References Cited

U.S. PATENT DOCUMENTS

| | | | | |
|---|---|---|---|---|
| 5,293,060 A | * | 3/1994 | Komori et al. | 257/544 |
| 5,384,279 A | * | 1/1995 | Stolmeijer et al. | 438/217 |
| 5,395,773 A | * | 3/1995 | Ravindhran et al. | 438/217 |
| 5,399,895 A | * | 3/1995 | Koga | 257/372 |
| 5,413,944 A | * | 5/1995 | Lee | 438/228 |
| 5,420,062 A | * | 5/1995 | Inada et al. | 438/228 |
| 5,470,774 A | * | 11/1995 | Kunitou | 438/278 |
| 5,478,759 A | * | 12/1995 | Mametani et al. | 438/228 |
| 5,525,823 A | * | 6/1996 | Chan | 257/369 |
| 5,578,507 A | * | 11/1996 | Kuroi | 438/474 |
| 5,641,699 A | * | 6/1997 | Hirase et al. | 438/241 |
| 5,674,763 A | * | 10/1997 | Sugiura et al. | 438/200 |

FOREIGN PATENT DOCUMENTS

| | | | | |
|---|---|---|---|---|
| JP | 2-153574 | * | 6/1990 | H01L/29/88 |
| JP | 5-211331 | * | 8/1993 | H01L/29/784 |

OTHER PUBLICATIONS

"Channel and Source/Drain Engineering in High–Performance Sub–0.1 um NMOSFETs Using X–Ray Lithography", H. Hu et al., 1994 Symposium on VLSI Technology Digest of Technical Papers, pp. 17–18.*

"A High Performance 0.15pm CMOS", G. G. Shahidi et al., 1993 Symposium on VLSI Technology Digest of Technical Papers, pp. 93–94.*

* cited by examiner

Primary Examiner—Carl Whitehead, Jr.
Assistant Examiner—Toniae M. Thomas
(74) Attorney, Agent, or Firm—McDermott, Will & Emery

(57) ABSTRACT

In a semiconductor device, a plurality of MIS transistors of the same conductivity type having different thresholds are formed at a main surface of semiconductor substrate, and impurity profiles on section extending in a depth direction from the main surface of the semiconductor substrate through respective channel regions of the plurality of MIS transistors have peaks located at different depths. This structure is formed by ion implantation performed on the respective channel regions with different implanting energies or different ion species. According to this semiconductor device, the thresholds of the MIS transistors can be individually controlled, and transistor characteristics optimum for uses can be obtained.

6 Claims, 21 Drawing Sheets

DEPTH FROM THE MAIN SURFACE OF
SEMICONDUCTOR SUBSTRATE [μm]
(A1-A2 SECTION)

DEPTH FROM THE MAIN SURFACE OF
SEMICONDUCTOR SUBSTRATE [μm]
(A1-A2 SECTION)

SEMICONDUCTOR DEVICE AND METHOD OF MANUFACTURING THE SAME

This application is a divisional of application Ser. No. 08/725,386 filed Oct. 3, 1996, now U.S. Pat. No. 6,144,079.

BACKGROUND OF THE INVENTION

1. Field of the Invention

The present invention relates to a structure for improving a performance of transistors of the same type formed in a common chip, and also relates to a method for manufacturing the same.

2. Description of the Background Art

FIG. 32 shows known transistors (conventional N-channel or P-channel transistors), which are of the same type and have different thresholds, and particularly shows a cross section taken along line extending lengthwise through gates. FIG. 32 shows, from the left, transistors having smallest to largest thresholds, i.e., a transistor forming a sense amplifier, a transistor forming a peripheral circuit and a transistor forming a memory cell.

In FIG. 32, a reference number 101 indicates a semiconductor substrate, 102 indicates an LOCOS (Local Oxidation of Silicon) isolating and insulating film, and 103 indicates a heavily doped layer for preventing punch through. A reference number 104 indicates a first impurity layer which is formed at a channel region A in an MIS (Metal Insulator Semiconductor) transistor forming a sense amplifier, and is located at a predetermined depth from a main surface of semiconductor substrate 101. A reference number 105 indicates a second impurity layer which is formed at a channel region B in an MIS transistor forming a peripheral circuit, and is located at a predetermined depth from a main surface of semiconductor substrate 101. A reference number 106 indicates a third impurity layer which is formed at a channel region C in an MIS transistor forming a memory cell, and is located at a predetermined depth from a main surface of semiconductor substrate 101.

In FIG. 32, a reference number 107 indicates a gate insulating film which is formed at the main surface of semiconductor substrate 101 and is made of a silicon oxide film or the like. 108 indicates a gate electrode which is formed on gate insulating film 107, and is made of an electrically conductive film of, e.g., doped polycrystalline silicon. 109 indicates a side wall which is formed of an insulating film on a side surface of gate electrode 109. Reference numbers 110 indicate source/drain regions of an LDD (Lightly Doped Drain) structure formed by diffusing impurity of a conductivity type opposite to that of the channel impurity layer.

First, second and third impurity layers 104, 105 and 106 shown in FIG. 32 are formed at positions spaced from the main surface of semiconductor substrate 101 by predetermined distances depending on only the types of transistors, respectively. The impurity layer for the transistor which should have a larger threshold has a larger impurity concentration, and in other words, the impurity concentration of the impurity layer for the sense amplifier is smaller than that for the peripheral circuit, which is smaller than that for the memory cell. By employing the impurity layers of different impurity concentrations for forming channel regions A, B and C, the thresholds can be controlled such that first impurity layer 104 having a large impurity concentration has a small threshold, and third impurity layer 106 having a small impurity concentration has a large threshold.

FIGS. 33 to 35 show impurity concentration profiles on sections XXXIII—XXXIII, XXXIV—XXXIV and XXXV—XXXV in FIG. 32 extending downward in a depth direction from the main surface of semiconductor substrate 101 of MIS transistors, respectively. More specifically, FIG. 33 shows an impurity concentration distribution in a depth direction at channel region A in the transistor for sense amplifier. This distribution exhibits a peak provided by first impurity layer 104 and another peak at a deeper position provided by heavily doped layer 103. Likewise, the impurity concentration distributions of the peripheral circuit and the memory cell are shown in FIGS. 34 and 35, respectively. The peak provided by second impurity layer 105 in the peripheral circuit is located at the same depth as first impurity layer 104, and exhibits a larger impurity concentration than that by first impurity layer 104. The peak provided by third impurity layer 106 in the memory cell is located at the same depth as those by first and second impurity layers 104 and 105, and exhibits a larger impurity concentration than those by first and second impurity layers 104 and 105.

For reference purposes, an impurity concentration profile by source/drain region 110 is shown, as an example, in FIG. 35. Since an impurity diffusion layer forming source/drain region 110 is not present immediately under gate electrode 108 in FIG. 32, FIG. 35 shows impurity concentration profiles taken on section XXXV—XXXV extending through source/drain region 110 of the transistor for memory cell in FIG. 32. In FIG. 35, junction is formed at a position where the impurity curve of the channel region intersects the impurity curve of source/drain region 110 of the opposite conductivity type.

A method of manufacturing the above conventional semiconductor device will be described below. First, as shown in FIG. 36, thermal oxidation is effected to form LOCOS isolating and insulating film 102 on each region which will form an inactive region in P-type semiconductor substrate 101. Then, wells are formed by selectively ion-implanting ions into regions for forming the N-type transistors under conditions of 500 KeV and 5E12 cm$^{-2}$. Thereafter, selective ion-implantation of, e.g., boron is performed under conditions of 100 KeV and 5E12 cm$^{-2}$ to form heavily doped layer 103 for isolation immediately under each LOCOS isolating oxide film 102. simultaneously with this, heavily doped layers 103 are formed under channel regions A, B and C.

Then, as shown in FIG. 37, boron is ion-implanted into the whole surface of semiconductor substrate 101 under conditions of 50 KeV and 2E12 cm$^{-2}$, whereby first impurity layer 104 of the transistor for sense amplifier is formed. Simultaneously with the formation of first impurity layer 104, first impurity layers 104 are formed at channel regions B and C of the transistors for peripheral circuit and memory cell.

As shown in FIG. 38, a resist pattern 111 is formed over the regions for transistors of a different type (P-channel transistors), the region of the transistor for sense amplifier and LOCOS isolating and insulating films 102 around the same, and boron is implanted into the regions for transistors for the peripheral circuit and memory cell under conditions of 50 KeV and 3E12 cm$^{-2}$. Further, impurity is implanted into channel region B of the peripheral circuit to form second impurity layer 105 having a larger impurity concentration than first impurity layer 104. Thereby, channel region C of the transistor for memory cell has the same concentration as second impurity layer 105.

As shown in FIG. 39, a resist pattern 112 is formed over regions other than the region for forming the transistor for memory cell. Using resist pattern 112 as a mask, ion implantation of boron is performed under conditions of 50 KeV and 2E12 cm$^{-2}$ for additionally introducing impurity into channel region C, so that third impurity layer 106 having a larger impurity concentration than second impurity layer 105 is formed.

In the conventional manufacturing method, as described above, first, second and third impurity layers 104, 105 and 106 are formed in the following manner. Ion implantation is performed several times for the heavily doped layer(s), and is performed one (or two) time(s) for the lightly doped layer(s), and all of the first and succeeding ion implanting operations are effected on positions at the same depth with the same implantation energy.

Japanese Patent Laying-Open No. 2-153574 (1990) has disclosed a technique similar to the above, and more specifically has disclosed the following technique. In transistors which have different thresholds but are of the same type, channel impurity layers having different impurity concentrations are formed at the same depth from a main surface of a semiconductor substrate. For forming causing a difference in impurity concentrations of the channel impurity layers, implantation is performed several times on a channel portion (at the same position) of a transistor(s) to be doped heavily.

According to the above structure, however, it is now required to increase impurity concentration for suppressing punch through, because channel lengths of transistors have been reduced in accordance with miniaturization of elements. Therefore, if channel implanting operations for three regions for the sense amplifier, peripheral circuit and memory cell were performed with the same energy, impurity concentrations would unpreferably increase at transistor surfaces of the regions for the sense amplifier and peripheral circuit, so that thresholds would unpreferably increase. In addition to this, since the impurity concentration is large at the channel region in the region for memory cell, the concentration is large at the junction between the source/drain region and the channel region, so that an excessively strong junction electric field is produced, and a junction leakage current increases.

SUMMARY OF THE INVENTION

An object of the invention is to provide a semiconductor device, in which transistors can have a low threshold while preventing punch through and a junction electric field with respect to source/drain regions can be restricted, and a method of manufacturing the same.

For achieving the above object, an aspect of the invention provides a semiconductor device, in which first and second MIS transistors of the same conductivity type are formed at a main surface of a semiconductor substrate, impurity concentration profiles on sections extending through channel regions of the first and second MIS transistors in a depth direction from the main surface of the semiconductor substrate have peaks at different depths.

According to the above structure, the two transistors on a common chip have the channel regions provided with the impurity layers, of which impurity concentrations have peaks at different peaks, so that thresholds of the transistors can be controlled, and thus each transistor can be optimized.

In a semiconductor device of another aspect of the invention, first and second MIS transistors of the same conductivity type are formed at a main surface of a semiconductor substrate, the first MIS transistor has a first channel region provided with a first impurity layer, the second MIS transistor has a second channel region provided with a second impurity layer, the second MIS transistor has a higher threshold voltage than the first MIS transistor, and the first impurity layer is formed at a position deeper from the main surface than the second impurity layer.

According to this structure, the channel regions of the two transistors formed on a common chip are provided with the impurity layers at different depths, so that thresholds of the transistors can be controlled, and thus each transistor can be optimized.

In the semiconductor device having the above structure, it is preferable that at least one of impurity concentration profiles at the first and second channel regions in the depth direction from the main surface has at least two peak values. By this structure, the transistor can suppress a low surface impurity concentration at the channel region and can have a low threshold.

In the semiconductor device of the above structure, it is preferable that the first and second impurity layers have different kinds of impurity. According to this structure, an impurity concentration distribution at a specified channel region can be controlled steeply. Therefore, a concentration at a junction between the source/drain region and the channel region can be low, so that a resistance against punch through can be improved and junction leakage can be suppressed.

In a semiconductor device of still another aspect of the invention, first, second and third MIS transistors of the same conductivity type are formed at a main surface of a semiconductor substrate, the first, second and third MIS transistors form a sense amplifier, a peripheral circuit and a memory cell, respectively, and impurity concentration profiles extending in a depth direction from the main surface through channel regions of the first, second and third MIS transistors have peaks at different depths, respectively.

Owing to the above structure, thresholds of the first, second and third MIS transistors can be controlled to take on values required in the sense amplifier, peripheral circuit and memory cell, respectively, so that the transistors can have characteristics optimized for their purposes, respectively.

In a semiconductor device of yet another aspect of the invention, first and second MIS transistors of the same conductivity type are formed at a main surface of a semiconductor substrate, the first and second MIS transistors have first and second channel regions, respectively, the first channel region is provided with a first heavily doped layer at a predetermined depth from the main surface, and the second channel region is provided with a second heavily doped layer at the substantially same depth as the first heavily doped layer from the main surface and is provided with an impurity layer between the second heavily doped layer and the main surface.

Owing to the above structure, a heavily doped layer common to the first and second channel regions can be formed at a relatively deep position for using the same for channel cut and threshold control of the first or second MIS transistor. In addition to the heavily doped layer, the second channel region is provided with the impurity layer at a position shallower than the heavily doped layer, whereby the threshold can be controlled further precisely.

In a preferred embodiment of the invention, the impurity layer formed at the second channel region has a plurality of layers formed at different depths between the second heavily doped layer and the main surface. This structure enables more precise and desirable distribution of impurity concentration in a depth direction.

In another preferred embodiment of the invention, impurity contained in the first and second heavily doped layers is made of a substance different from that of impurity contained in the impurity layer. Since the second heavily doped layer and the impurity layer in the second channel region have the impurity layers containing different kinds of impurity, the impurity concentration distributions can be selectively set steep. Consequently, a concentration at a junction between the source/drain region and the channel region can be low, so that a resistance against punch through can be improved and junction leakage can be suppressed.

A method of manufacturing a semiconductor device of an aspect of the invention, and particularly forming, at a main surface of a semiconductor substrate, a first MIS transistor having a first channel region and a second MIS transistor having a second channel region, includes the steps of: forming first and second active regions at the main surface of the semiconductor substrate for forming the first and second MIS transistors, respectively; forming the first channel region having a first impurity layer by implanting ions with a predetermined ion implanting energy into a region for the first channel region in the first active region; forming the second channel region having a second impurity layer by implanting ions with an ion implanting energy different from the predetermined ion implanting energy into a region for the second channel region in the second active region; forming a gate insulating film on the first and second channel regions; forming gate electrodes on the first and second channel regions with the gate insulating film therebetween, respectively; and forming source/drain regions at positions in the main surface located at opposite sides of each of the first and second channel regions.

According to this manufacturing method, the first and second impurity layers for the first and second MIS transistors are formed by ion implantation at different steps, so that the channel regions can have impurity concentration profiles optimized for the transistors, respectively. Consequently, it is possible to fabricate the semiconductor device having the transistors of the optimum characteristics.

In a preferred embodiment of the invention, the steps of forming the first and second channel regions are performed by ion implantation with different ion implanting energies or of different ion species. Thereby, impurity profiles at the channel regions can be controlled individually, so that it is possible to optimize characteristics of the first and second MIS transistors having different thresholds.

A method of manufacturing a semiconductor device of another aspect of the invention, and particularly forming, at a main surface of a semiconductor substrate, a first MIS transistor having a first channel region and a second MIS transistor having a second channel region includes the steps of: forming, at the main surface of the semiconductor substrate, first and second active regions for forming the first and second MIS transistors, respectively; forming first and second heavily doped layers by effecting ion implantation with a predetermined ion implanting energy on regions for the first and second channel regions in the first and second active regions, respectively; forming, at a region for the second channel region in the second active region, an impurity layer located between a position for forming the second heavily doped layer and the main surface; forming a gate insulating film on the first and second channel regions; forming gate electrodes on the first and second channel regions with the gate insulating film therebetween; and forming source/drain regions at positions in the main surface located at opposite sides of each of the first and second channel regions.

According to the above method of manufacturing the semiconductor device, the impurity layer can be selectively formed and located between the main surface of the second channel region of the second transistor and the second heavily doped layer, whereby the thresholds can be controlled to attain optimum values, and an effect of channel cut can be expected in the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
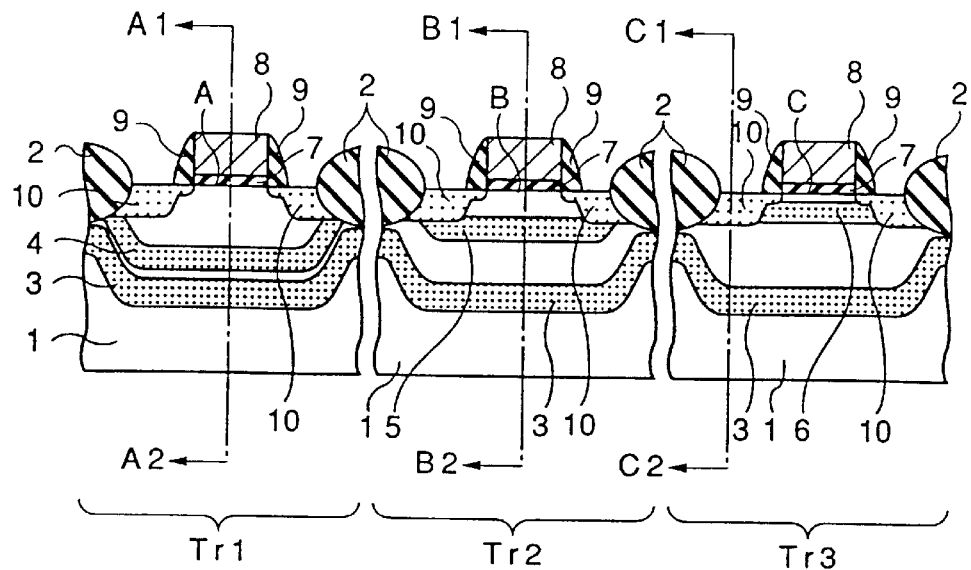
FIG. 1 is a cross section showing a structure of a semiconductor device of an embodiment 1 of the invention.

FIG. 1 shows a section of a semiconductor device of an embodiment 1 of the invention, and particularly shows sections in a gate length direction of MIS transistors which are formed on a common chip and are used for a sense amplifier, a peripheral circuit and a memory cell.

Referring to FIG. 1, a semiconductor substrate 1 is provided with active regions for forming the sense amplifier, peripheral circuit and memory cell, which are electrically isolated from each other by LOCOS isolating and insulating films 2 and are aligned in this order from the left to the right in the figure.

The neighboring active regions are electrically isolated by LOCOS isolating and insulating films 2, and a heavily doped layer 3 for channel cut is formed for preventing electrical connection between the neighboring transistors via the interior of the semiconductor substrate. Heavily doped layer 3 is in contact with the bottoms of LOCOS isolating and insulating films 2, is formed by ion implantation of impurity of the same conductivity type as impurity which wells contains, and have portions located deep under the channel regions in transistor formation regions, i.e., regions for forming the transistors. The above three kinds of active regions are provided with channel regions A, B and C for forming the sense amplifier, peripheral circuit and memory cell, respectively.

At a relatively deep position in channel region A of the transistor for sense amplifier, there is formed by ion implantation a first impurity layer 4, which contains impurity of the same conductivity type as the well and is located above heavily doped layer 3. At channel region B of the transistor for peripheral circuit, there is formed by ion implantation a second impurity layer 5, which contains impurity of the same conductivity type as the well and is located at a shallower position than first impurity layer 4. At channel region C for the transistor for memory cell, there is formed by ion implantation a third Impurity layer 6, which contains impurity of the same conductivity type as the well and is located at a shallower position than second impurity layer 5.

A gate insulating film 7 is formed on each of channel regions A, B and C of the transistors, e.g., by thermal oxidation. A gate electrode 8 made of polycrystalline silicon or the like is formed on each gate insulating film 7. Source/drain regions of an LDD structure are formed at the main surface of semiconductor substrate 1 and are located at opposite sides of each channel region. Areas of heavily doped layer 3 and first, second and third impurity layers 4, 5 and 6 shown in belt-like forms in FIG. 1 contain impurity at concentrations which are higher than reference impurity concentrations of these layers, respectively. Gate electrode 8 of transistor Tr1 for sense amplifier has a gate length of 0.5 $\mu$m and a gate width of 2.0 $\mu$m. Gate electrode 8 of transistor Tr2 for peripheral circuit formed on the same chip as transistor Tr1 has a gate length of 0.35 $\mu$m and a gate width from 1 to 10 $\mu$m. Gate electrode 8 of transistor Tr3 for memory cell has a gate length of 0.25 $\mu$m and a gate width of 0.4 $\mu$m.

Figure 2:
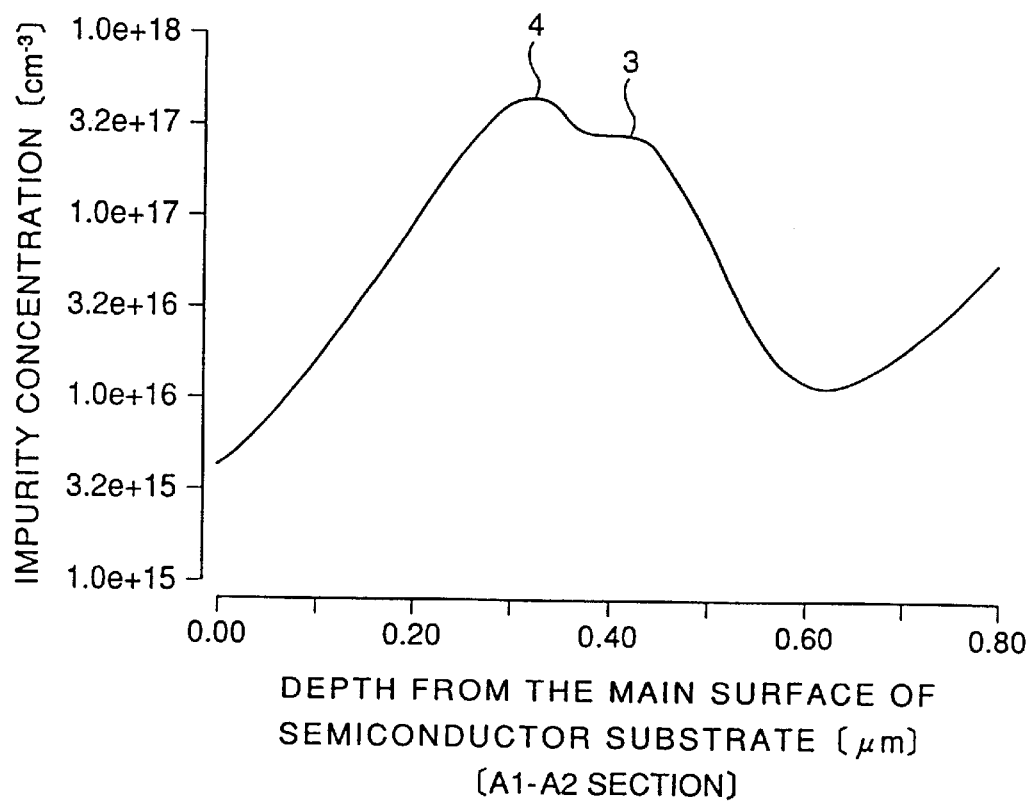
FIG. 2 shows an impurity concentration profile on a section taken along line II—II in FIG. 1.
Figure 3:
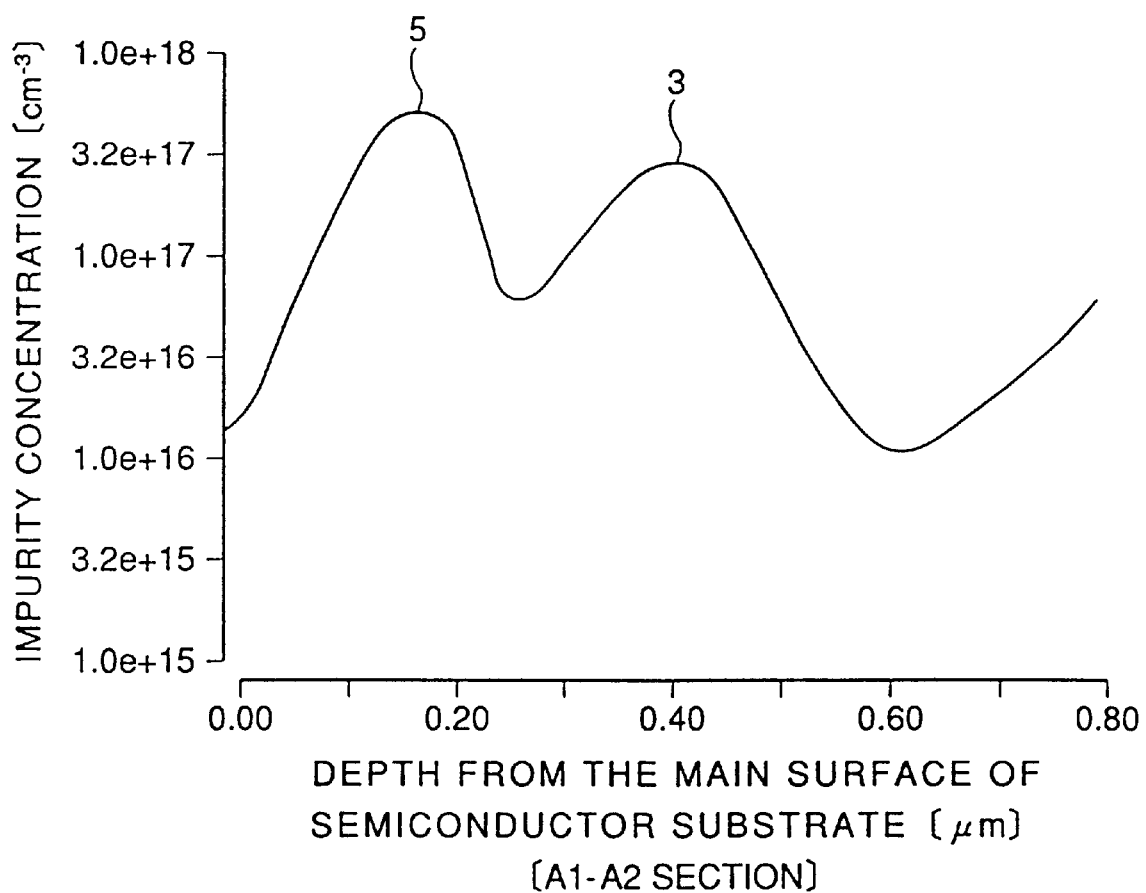
FIG. 3 shows an impurity concentration profile on a section taken along line III—III in FIG. 1.
Figure 4:
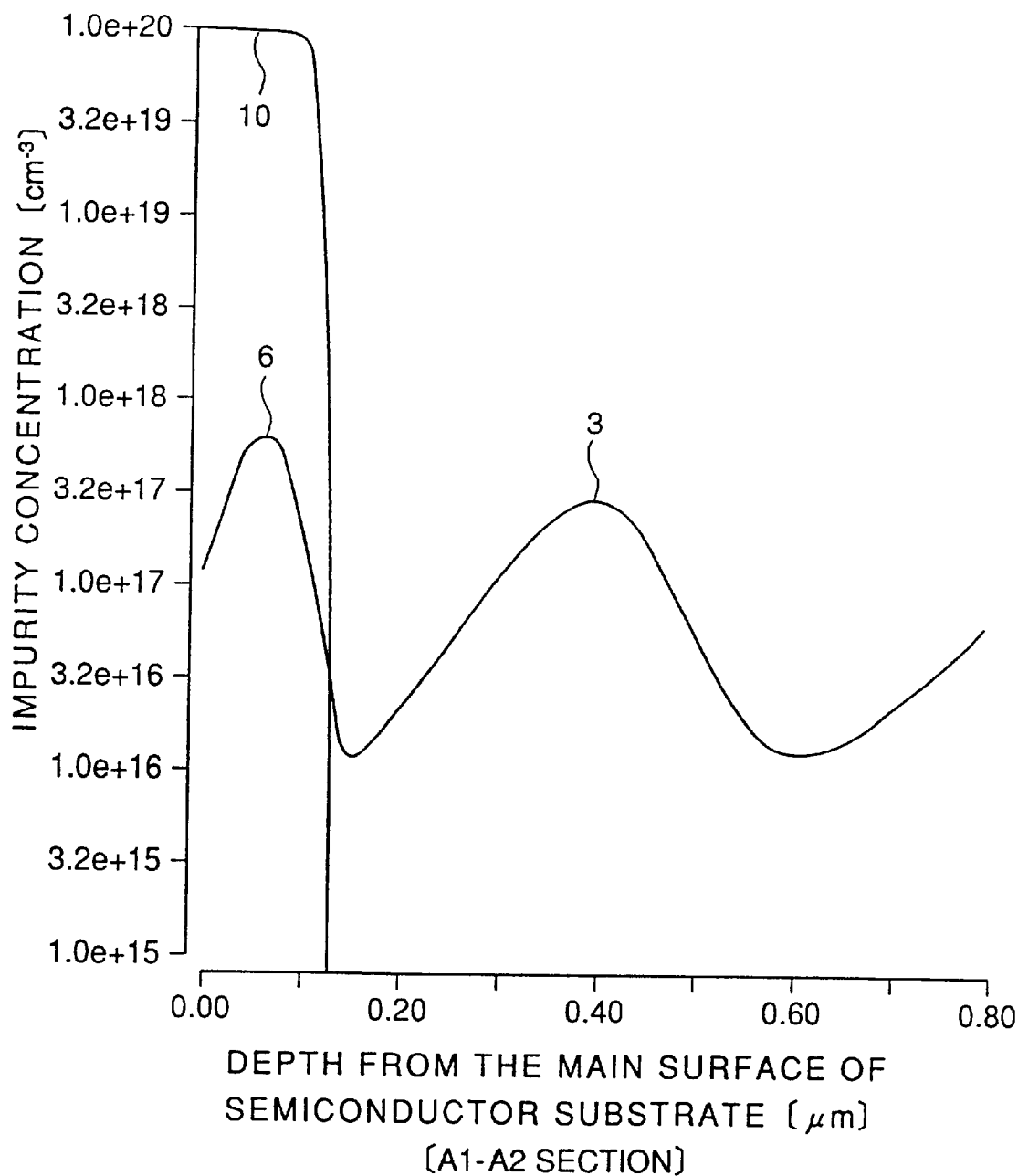
FIG. 4 shows an impurity concentration profile on a section taken along line IV—IV in FIG. 1.

FIG. 2 shows an impurity concentration profile on a section of the transistor for sense amplifier taken along line II—II in FIG. 1, and therefore a section extending downward from the main surface of semiconductor substrate 1 in channel region A. FIG. 3 shows an impurity concentration profile on a section in channel region B of the transistor for peripheral circuit taken along line III—III in FIG. 1. FIG. 4 shows an impurity concentration profile on a section taken along line IV—IV and extending through source/drain region 10, and, for reference purposes, shows an impurity concentration at the source/drain region.

The following can be seen from FIGS. 2 to 4. For the transistor for sense amplifier which should have a low threshold, a peak of impurity concentration of first impurity layer 4 is located at a deep position in semiconductor substrate 1. For the transistor for memory cell of which should have a high threshold, a peak of the impurity concentration of third impurity layer 6 is located near the main surface of semiconductor substrate 1. For the transistor for peripheral circuit which should have a medium threshold, a peak of the concentration of second impurity layer 5 is located intermediate between the peaks positions in impurity layer 4 and impurity layer 6.

A method of manufacturing the semiconductor device in FIG. 1 will be described below.

Figure 5:
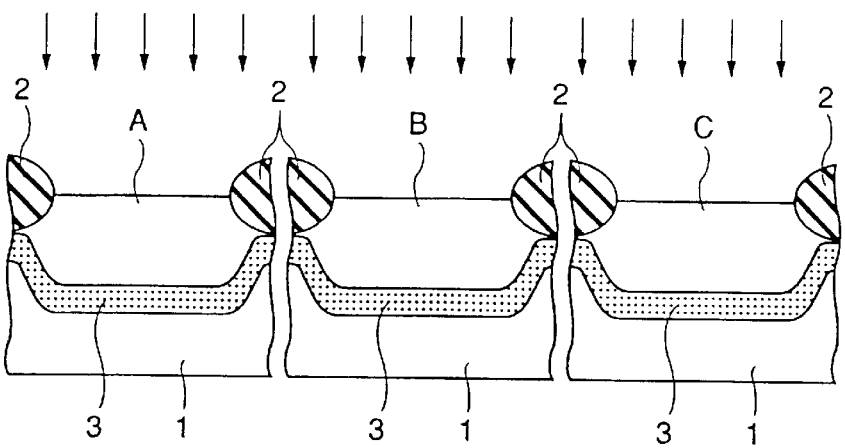
FIGS. 5 to 8 are cross sections showing steps of manufacturing the semiconductor device of the embodiment 1 of the invention, respectively.

As shown in FIG. 5, LOCOS isolating and insulating films 2 of 3600 Å in thickness are formed at regions which will form the inactive regions in P-type semiconductor (silicon) substrate 1, and thereby a plurality of active regions for forming the MIS transistors are formed. Then, regions at which P-type MOSFETs (which will be simply referred to as "P-type transistors" hereinafter) are formed are masked with a resist, and boron is implanted into only regions, at which N-type transistors are to be formed, for forming wells under conditions of, e.g., 500 KeV and 5E12 cm$^{-2}$.

Then, a resist pattern is formed on regions at which P-type transistors are to be formed, and ion implantation of, e.g., boron is performed under conditions of 150 KeV and 1E12 cm$^{-2}$, whereby heavily doped layer 3 for channel cut is formed at regions where n-type transistors are to be formed. Heavily doped layer 3 thus formed is located immediately under LOCOS isolating and insulating films 2 and at a relatively deep area in the regions forming the channels of transistors, and has an impurity concentration of which peak is present at a depth of 4000 Å from the main surface of semiconductor substrate 1.

Figure 6:
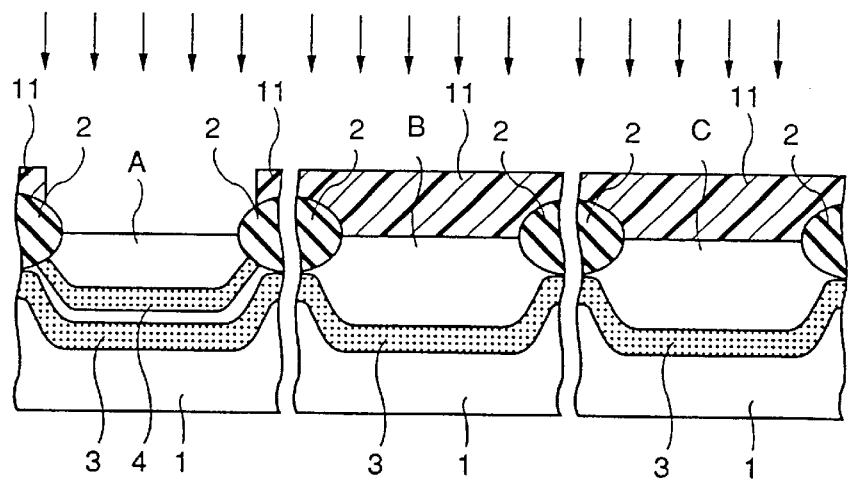

As shown in FIG. 6, a resist mask 11 is formed over regions other that the region for forming the N-type transistor for sense amplifier, and ion implantation of, e.g., boron is performed under conditions of 100 KeV and 7E12 cm$^{-2}$ to form first impurity layer 4. The impurity concentration of first impurity layer 4 thus formed has a peak at a depth of about 3000 Å from the main surface of semiconductor substrate 1. After this ion implantation, resist mask 11 is removed.

Figure 7:
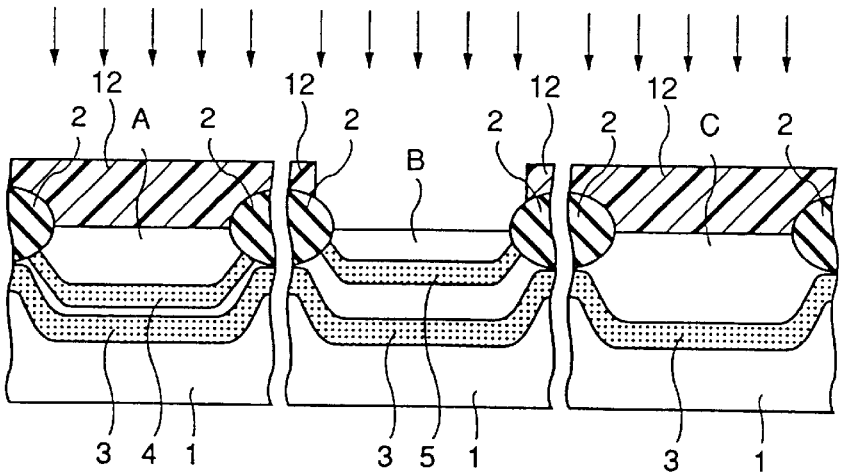

As shown in FIG. 7, a resist mask 12 is formed over regions other than the region for forming the N-type transistor for peripheral circuit, and ion implantation of, e.g., boron is performed under conditions of 50 KeV and 6E12 cm$^{-2}$ to form second impurity layer 5. The impurity concentration of second impurity layer 5 thus formed has a peak at a depth of about 1700 Å from the main surface of semiconductor substrate 1. After this ion implantation, resist mask 12 is removed.

Figure 8:
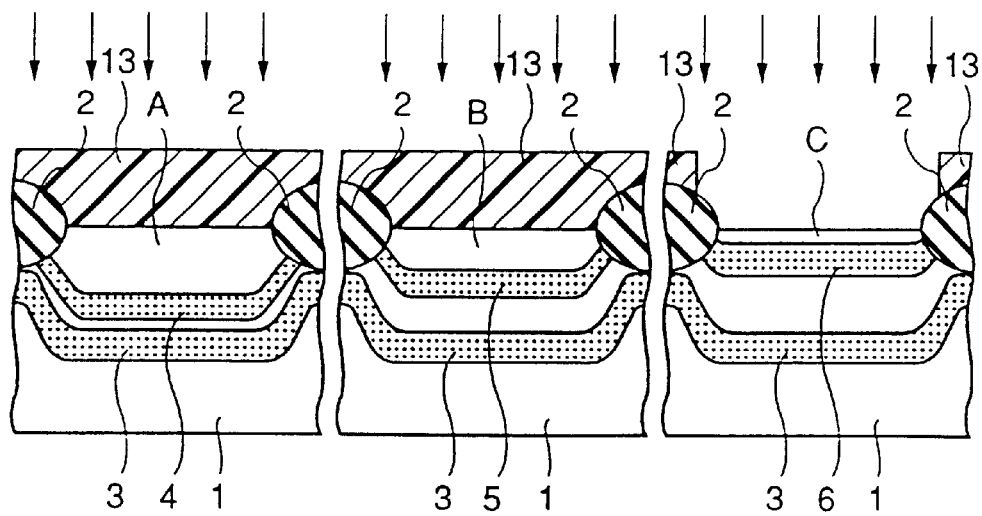

As shown in FIG. 8, a resist mask 13 is formed over regions other than the region for forming the N-type transistor for memory cell, and ion implantation of, e.g., boron is performed under conditions of 20 KeV and 5E12 cm$^{-2}$ to form third impurity layer 6. The impurity concentration of third impurity layer 6 thus formed has a peak at a depth of about 800 Å from the main surface of semiconductor substrate 1. After this ion implantation, resist mask 13 is removed.

Thermal oxidation is performed to form gate insulating films 7 of 110 Å in thickness, and a layer, e.g., of polycrystalline silicon having a thickness of 2000 Å is formed. These film and layer are patterned into an appropriate configuration to form gate electrodes 8. Thereafter, tilt rotary implantation of, e.g., arsenic is performed under conditions of 40 KeV, 45 degrees and 6E12 cm$^{-2}$ for forming lightly doped regions (n$^-$regions) of source/drain regions 10 of an LDD structure at the surface of semiconductor substrate 1.

Then, a film such as a TEOS (Tetraethyl Orthosilicate) oxide film of 1000 Å in thickness is formed, and subsequently is etched back to form side walls 9 on side surfaces of gate electrodes 8. Then, impurity such as arsenic is implanted under conditions of 60 KeV and 3E15 cm$^{-2}$ to form heavily doped regions (n$^+$region at concentration of 1E20 cm$^{-3}$) of source/drain regions 10 at areas from the main surface to a depth of 0.1 μm. Through the above steps, the semiconductor device in FIG. 1 is formed.

In the semiconductor device thus formed, since the impurity concentrations as well as positions or depths of peaks in the impurity concentration profiles are controlled depending on uses of transistors to be formed, i.e., the sense amplifier, peripheral circuit and memory cell, characteristics of the respective transistors can be optimized.

In the transistor, e.g., for the sense amplifier, since the channel profile is formed relatively deep as shown in FIG. 2, the impurity concentration at the main surface of semiconductor substrate 1 can be small even if the impurity concentration has a large peak, so that the punch through can be suppressed and the threshold can be low.

Since the channel profile at the memory cell part is formed at a relatively shallower position as shown in FIG. 4, it is possible to suppress a junction concentration, i.e., a concentration of impurity at a crossing position with respect to the profile at source/drain region 10, and the junction electric field can be small, so that the junction leakage current can be small.

In addition to the above, a threshold of the transistor for peripheral circuit can be set to a medium value by locating the peak position of impurity concentration at an intermediate position between those of the sense amplifier and the memory cell.

In the method of manufacturing the semiconductor device shown in FIG. 1, impurity is selectively implanted with different implanting energies into the respective regions for the sense amplifier, peripheral circuit and memory cell, for which transistors of different thresholds are to be formed, so that it is possible to form the first, second and third impurity layers 4, 5 and 6 having the impurity concentration peaks at different positions, and thus the semiconductor device having the optimum characteristics can be formed by such impurity ion implantation.

Although formation of the N-type transistors has been described, P-type transistors can be manufactured by forming N-wells and subsequently performing processes similar to those for forming the N-type transistors except for that impurity species of the opposite conductivity type is used. Impurity species other than the above may be employed, and threshold characteristics of transistors for different purposes can be set by employing a similar relationship between intensities of the ion implanting energies.

In the semiconductor device described above, all of gate insulating films 7, gate electrodes 8 and source/drain regions 10 have common sizes, different sizes suitable to the required characteristics of transistors may be selectively determined by performing processes at different steps.

Embodiment 2

An embodiment 2 of the invention will be described below.

Figure 9:
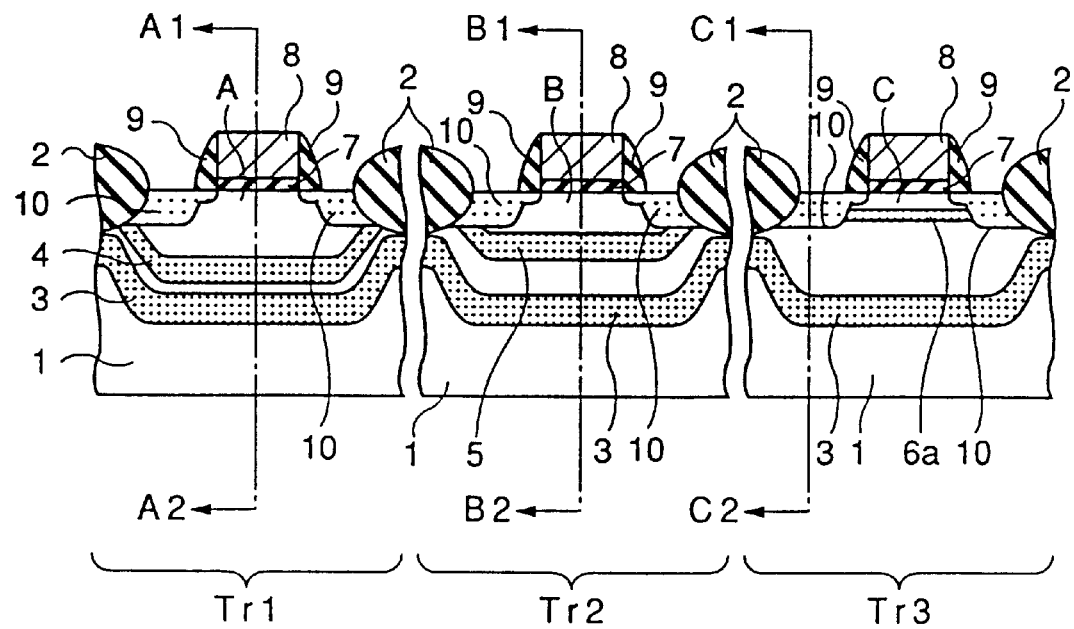
FIG. 9 is a cross section showing a structure of a semiconductor device of an embodiment 2 of the invention.

In the embodiment 1 already described, all of first, second and third impurity layers forming channel regions A, B and C for sense amplifier, peripheral circuit and memory cell contain the same kind of impurity (e.g., boron). In contrast to this, a semiconductor device of the embodiment 2 has such a feature that, as shown in FIG. 9, a third impurity region 6a formed at channel region C of the transistor for memory cell, which should have the highest threshold, is made of a substance (e.g., indium) different from that contained in the other, i.e., first and second impurity layers 4 and 5.

Figure 10:
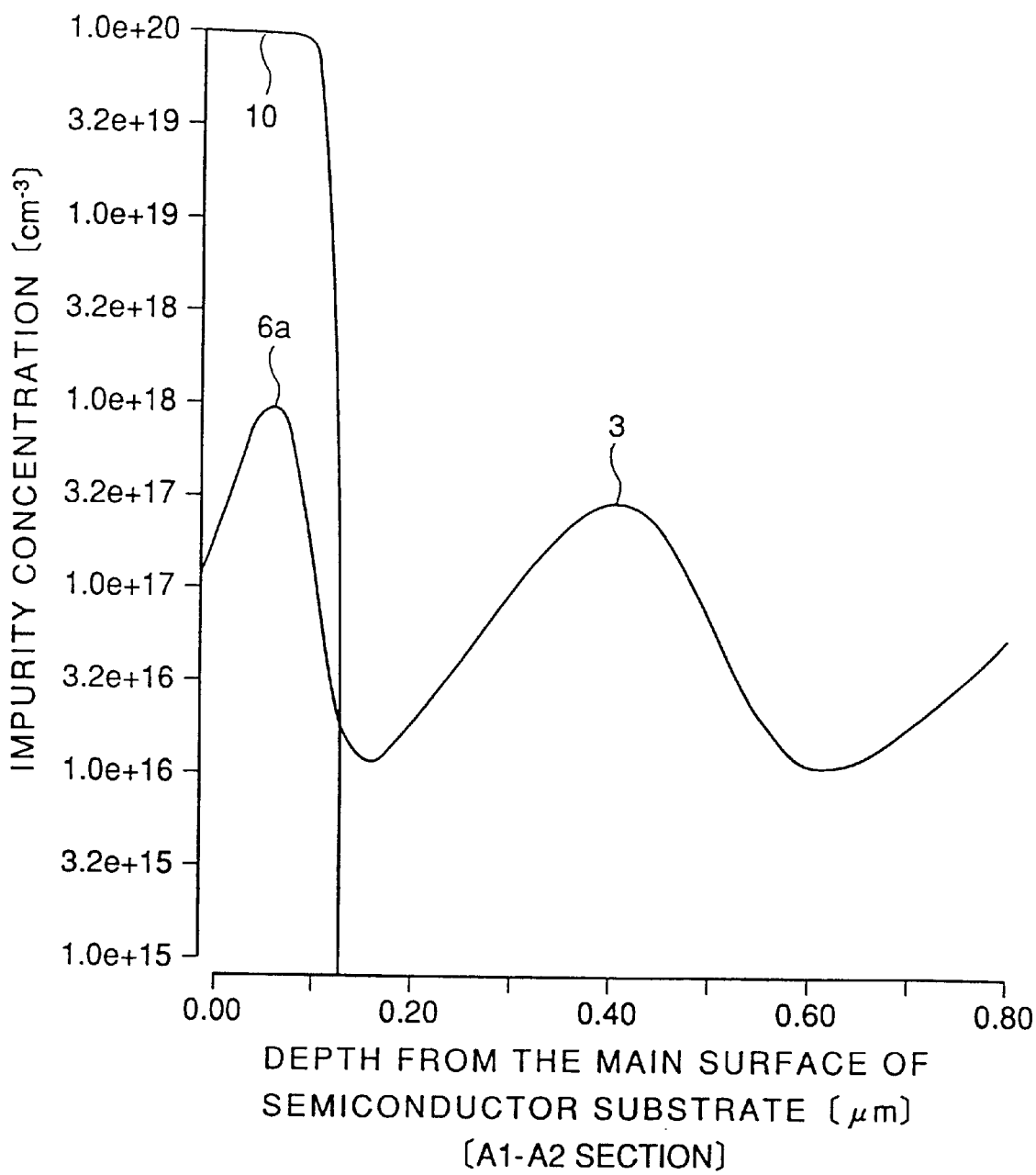
FIG. 10 shows an impurity concentration profile on a section taken along line X—X in FIG. 9.

FIG. 10 shows an impurity concentration profile on a section X—X which extends downward from the main surface of semiconductor substrate 1 in the transistor for memory cell of the embodiment 2.

This impurity concentration profile has a peak at a shallow position from the main surface, and also has a peak at a deeper position provided by heavily doped layer 3 formed for channel cut.

Figure 11:
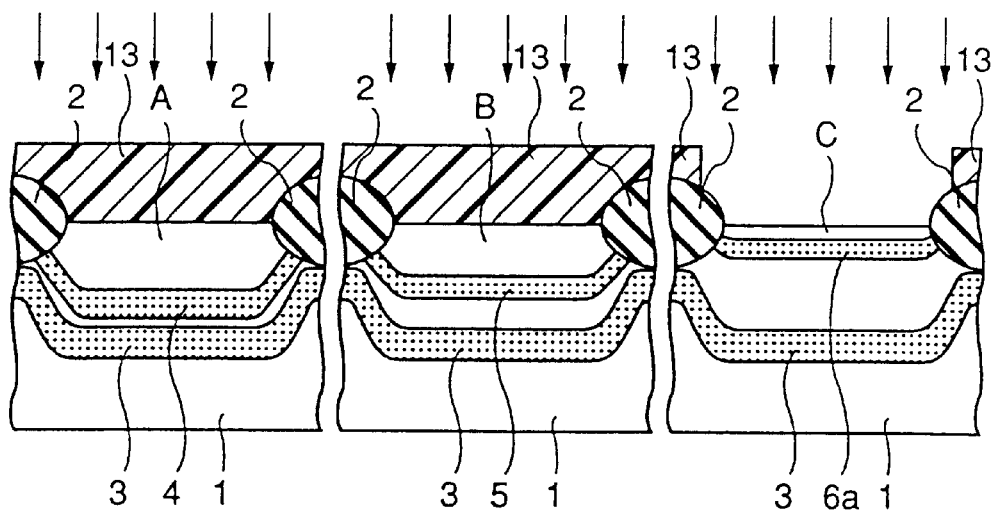
FIG. 11 is a cross section showing a step of manufacturing the semiconductor device of the embodiment 2 of the invention.

A method of manufacturing the semiconductor device in FIG. 9 will be described below. First, processing is performed similarly to that of the embodiment 1 shown in FIGS. 5 to 7, so that LOCOS isolating and insulating films 2, heavily doped layer 3, and first and second impurity layers 4 and 5 are formed. Then, similarly to the embodiment 1, resist mask 13 is formed over the regions other than the region at which the N-type transistor for memory cell is to be formed, and then, as shown in FIG. 11, indium is ion-implanted, which is a distinctive feature of this embodiment. This ion implantation is performed under conditions of 50 KeV and 1E13 cm$^{-2}$, whereby third impurity layer 6a containing indium is formed near the main surface of semiconductor substrate 1.

Thereafter, resist mask 13 is selectively removed, and processing is performed similarly to the embodiment 1 to form successively gate insulating films 7, gate electrodes 8, lightly doped regions (N$^-$regions) of the impurity diffusion layers for the LDD structure, side walls 9 and source/drain regions 10 formed of the lightly doped regions (N$^-$region) which is already formed and the heavily doped regions (N$^+$regions) which are newly formed, so that the semiconductor device in FIG. 9 is completed.

In the semiconductor device thus formed, ions of substance larger in mass than boron are used for channel implantation of the memory cell transistor, so that it is possible to provide a steep impurity concentration profile as shown in FIG. 10 while increasing a peak impurity concentration, and the concentration at the junction with source/drain region 10 (i.e., at crossing position with respect to the impurity concentration profile in FIG. 10) can be restricted to a small value.

Thereby, the transistor which can have an improved resistance against punch through and can suppress the junction leakage can be formed as the transistor, e.g., for memory cell while maintaining the performance of transistors for sense amplifier and peripheral circuit.

Although the indium has been described as an example, another impurity may be used provided that it has a mass larger than generally used boron and is of the same conductivity type. Naturally, the implanting energy and the impurity concentration may be varied in the basically same manner in view of relative sizes between the transistors. Indium may be used as the impurity selectively for the channel regions of the transistors for peripheral circuit and sense amplifier.

Embodiment 3

An embodiment 3 of the invention will be described below.

In the embodiment 1 already described, each of channel regions A, B and C is formed of only a single impurity layer. In contrast to this, the embodiment 3 has such a distinctive feature that, as shown in FIG. 12, a plurality of impurity layers are formed at each of channel regions B and C of the transistor for peripheral circuit having a medium threshold and the transistor for memory cell having a high threshold.

Figure 12:
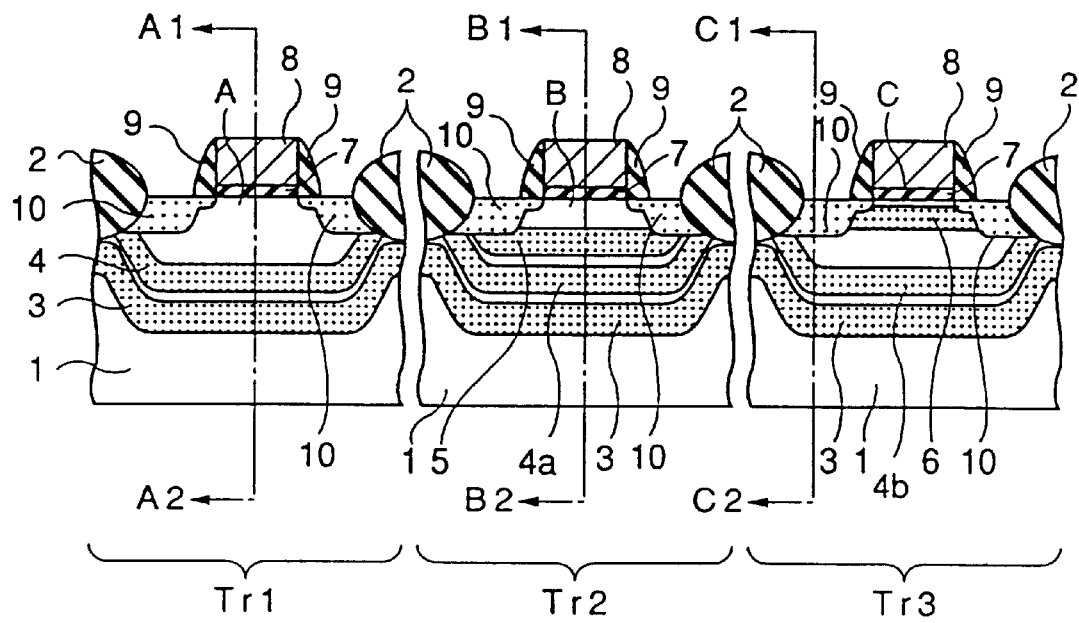
FIG. 12 is a cross section showing a structure of a semiconductor device of an embodiment 3 of the invention.

As shown in FIG. 12, each of channel regions B and C of the transistor for peripheral circuit shown at the middle in the figure and the transistor for memory cell shown at the right in the figure is provided with second or third impurity layer 5 or 6 which is the same as that formed at the channel region of the corresponding transistor in the semiconductor device shown in FIG. 1, and is additionally provided with first impurity layer 4a or 4b located between second or third impurity layer 5 or 6 and heavily doped layer 3. Each of first impurity layers 4a and 4b has an impurity concentration profile similar to that of first impurity layer 4 formed at channel region A of the transistor for sense amplifier.

Figure 13:
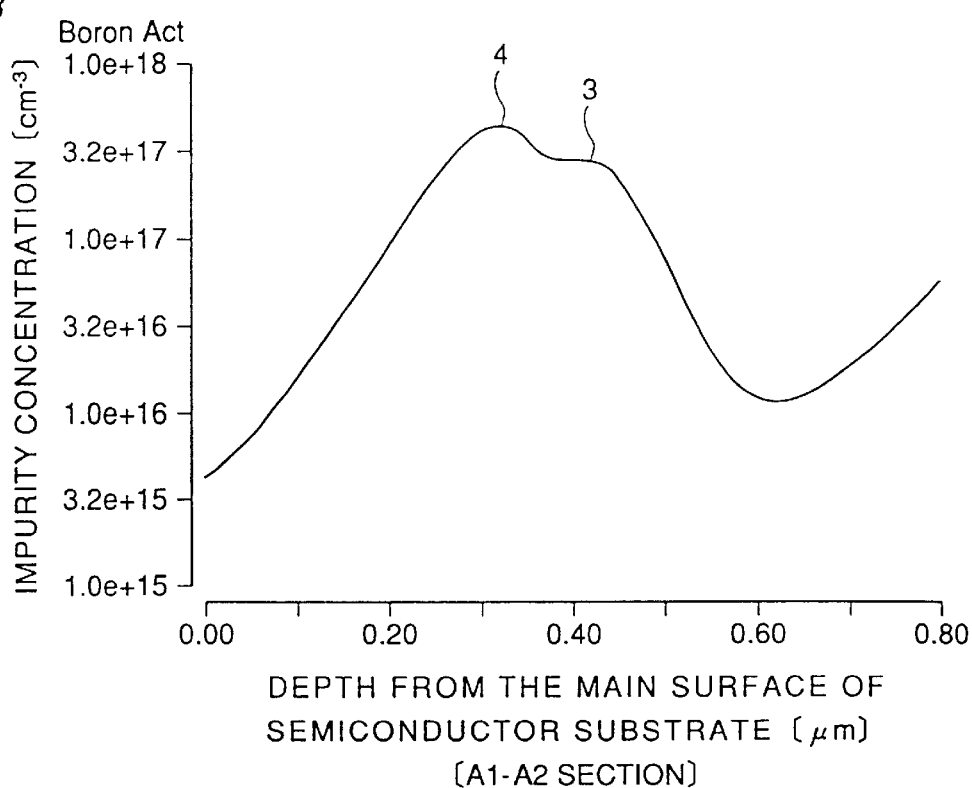
FIG. 13 shows an impurity concentration profile on a section taken along line XIII—XIII in FIG. 12.
Figure 14:
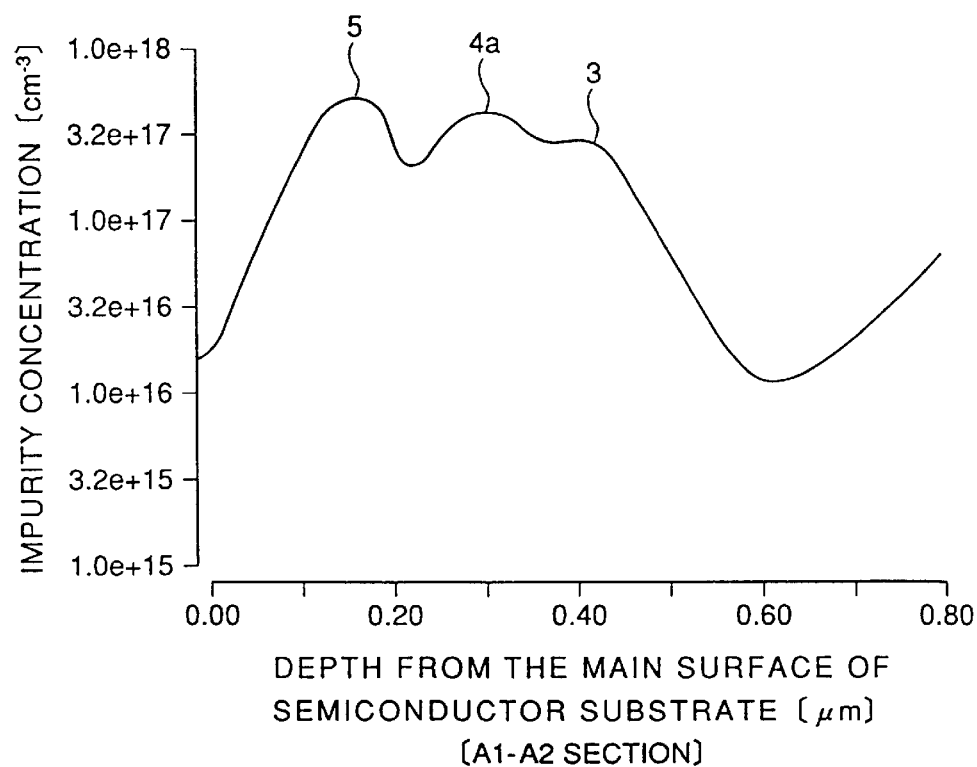
FIG. 14 shows an impurity concentration profile on a section taken along line XIV—XIV in FIG. 12.
Figure 15:
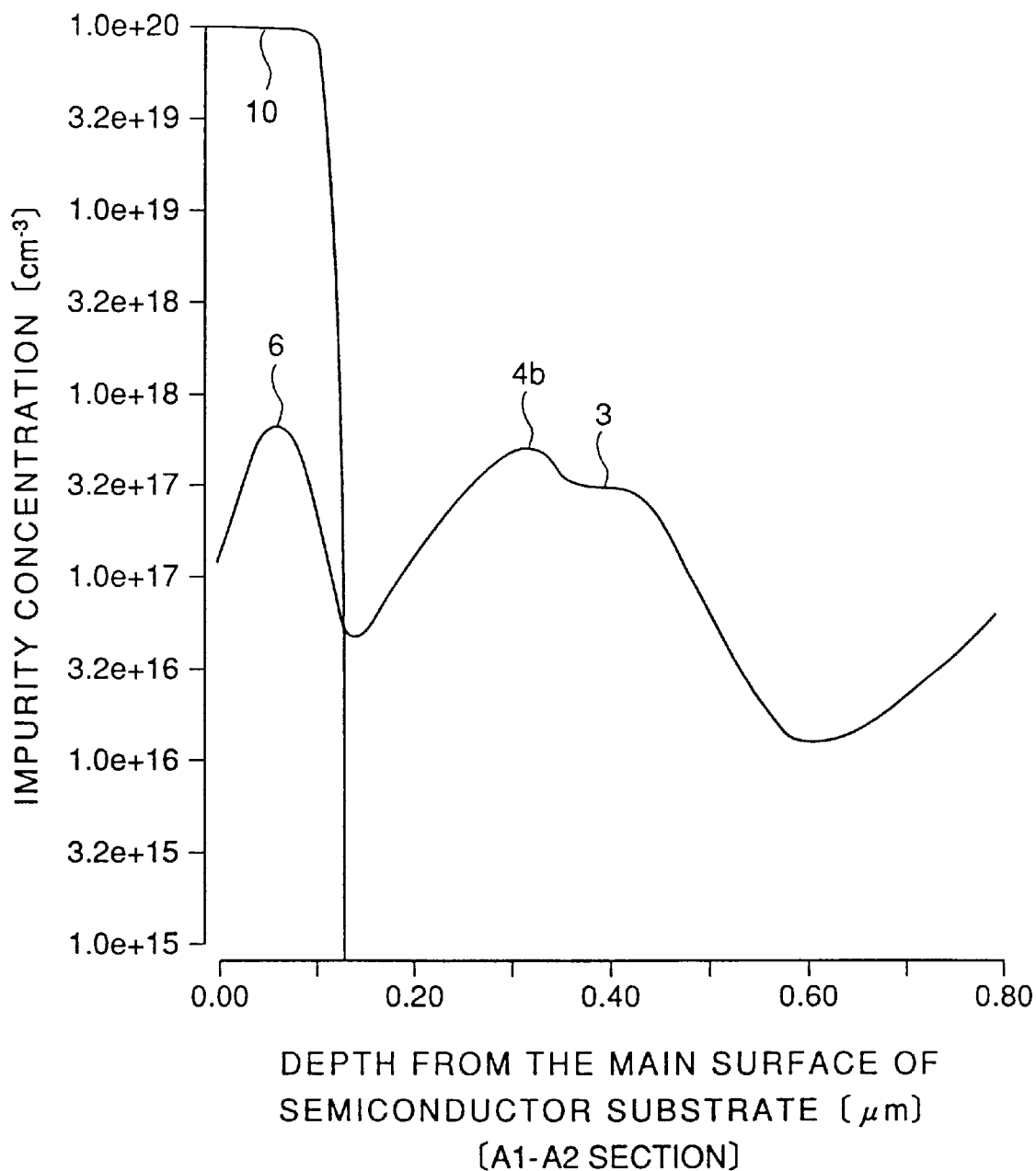
FIG. 15 shows an impurity concentration profile on a section taken along line XV—XV in FIG. 12.

FIGS. 13, 14 and 15 show the impurity concentration profiles on sections extending downward from the main surface, and particularly on sections XIII—XIII, XIV—XIV and XV—XV of the transistors for sense amplifier, peripheral circuit and memory cell in the semiconductor device shown in FIG. 12, respectively. The profiles on sections XIII—XIII and XIV—XIV show the impurity concentration profiles at the channel regions of the transistors, and the profile on section XV—XV shows the impurity concentration profile through source/drain region 10 for understanding a relationship with the impurity concentration at source/drain region 10.

As shown in FIG. 13, the impurity concentration profile on section XIII—XIII is similar to that of the embodiment 1 shown in FIG. 2. As shown in FIG. 14, the impurity concentration profile on section XIV—XIV of the transistor having a medium threshold has such a feature that a peak provided by first impurity layer 4a is located between the peaks provided by heavily doped layer 3 and second impurity layer 5 at channel region B of the transistor for peripheral circuit corresponding to those of the embodiment 1 in FIG. 3. As shown in FIG. 15, the impurity concentration profile on section XV—XV of the transistor having a high threshold has such a feature that a peak by first impurity layer 4b is located between the peaks by heavily doped layer 3 and third impurity layer 6 at channel region C of the transistor for memory cell corresponding to those of the embodiment 1 shown in FIG. 4.

Description will now be given on a method of manufacturing the semiconductor device of the embodiment 3 shown in FIG. 12. As already described with reference to FIG. 5 showing the embodiment 1, LOCOS isolating oxide films 2 are formed at the main surface of semiconductor substrate 1, resist mask 11 is formed selectively over regions other that those for forming the N-type transistors, and boron is implanted into the regions for N-type transistors to form the wells. Through resist mask 11, processing is performed to form heavily doped layer 3 immediately under LOCOS isolating and insulating films 2 and at regions which will form channel regions A, B and C in semiconductor substrate 1.

Figure 16:
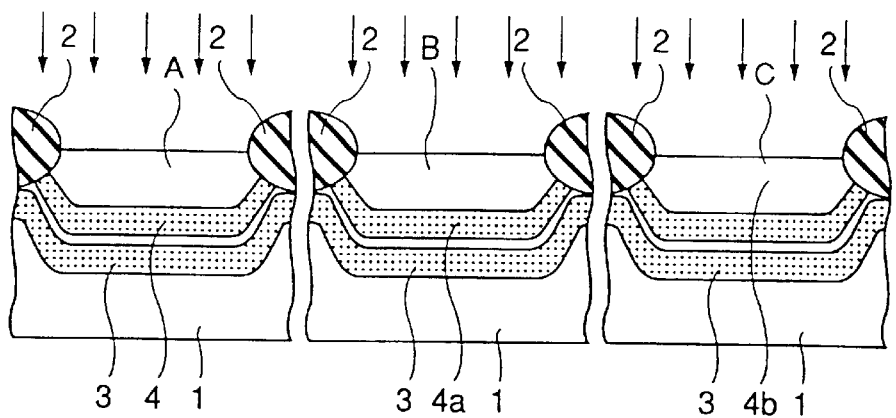
FIGS. 16 to 18 are cross sections showing steps of manufacturing the semiconductor device of the embodiment 3 of the invention, respectively.

Thereafter, processing is performed in a manner different from that of the embodiment 1 shown in FIG. 6, in which resist mask 11 is formed over the regions other than that for forming the N-type transistor for sense amplifier, and selective ion implantation is performed only on the region for sense amplifier to form first impurity layer 4. More specifically, according to the embodiment 3, impurity such as boron is ion-implanted into the whole surface of the regions for forming the N-type transistors through resist mask 11 already formed under conditions of 150 KeV and 1E12 cm$^{-2}$, whereby, as shown in FIG. 16, first impurity layers 4, 4a and 4b are formed at channel regions A, B and C for the transistors for sense amplifier, peripheral circuit and memory cell, regardless of the thresholds of transistors to be formed. Then, resist mask 11 is removed.

Figure 17:
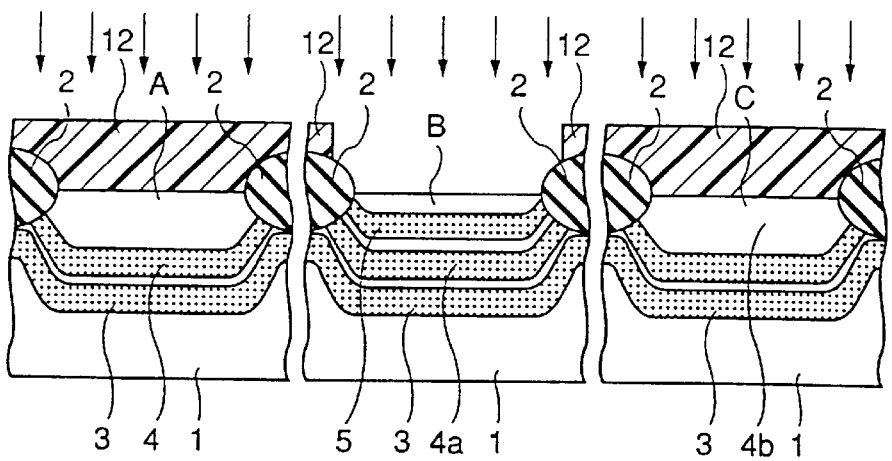
Figure 18:
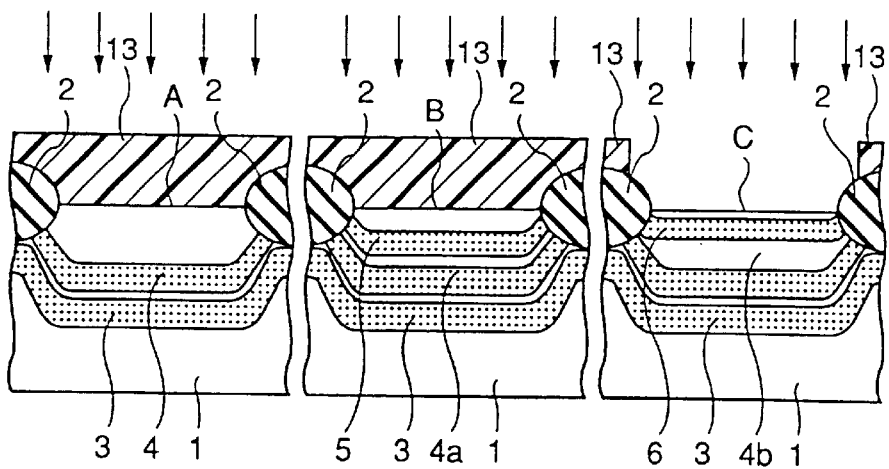

Thereafter, similarly to the embodiment 1, resist mask 12 is formed over the regions other than that for forming the N-type transistor for peripheral circuit as shown in FIG. 17, and impurity such as boron is ion-implanted into channel region B for the N-type transistor for peripheral circuit under conditions of 50 KeV and 6E12 cm$^{-2}$, so that second impurity layer 5 is formed at a level higher than first impurity layer 4a already formed. Further, resist mask 13 is formed as shown in FIG. 18, and impurity such as boron is selectively ion-implanted into channel region C for the memory cell transistor under conditions of 20 KeV and 8E12 cm$^{-2}$, so that third impurity layer 6 is formed at a position above first impurity layer 4b already formed and is located near the main surface of semiconductor substrate 1.

Thereafter, resist pattern 13 is selectively removed, and gate insulating films 7, gate electrodes 8, side walls 9 and source/drain regions 10 of the LDD structure are successively formed similarly to the embodiment 1, so that the semiconductor device shown in FIG. 12 is completed. Likewise, P-type transistors may be formed through the same processes as those for the N-type transistors by employing ion species of the opposite conductivity type for ion implantation.

In the semiconductor device thus fabricated, since not only the impurity concentrations but also peak positions at the impurity concentration profiles are controlled at channel regions A, B and C having different thresholds, the semiconductor device can have structures of which characteristics are optimized for the respective transistors for sense amplifier, peripheral circuit and memory cell. Further, in the embodiment 3, since ion implantation for channel region A of the transistor for sense amplifier is effected on the whole surface of the regions for forming the N-type transistors, resist mask 11 can be commonly used for formation of heavily doped layer 3 and formation of first impurity layers 4, 4a and 4b, so that the semiconductor device having the optimum characteristics can be manufactured through a reduced number of manufacturing steps.

Further, first impurity layers 4a and 4b are formed at channel regions B and C of the transistors for peripheral circuit and memory cell, respectively, so that heavily doped layers can be located relatively deep in channel regions B and C. Therefore, a dose of implantation for shallow regions can be reduced, and thresholds of the semiconductor device can be reduced as a whole.

Embodiment 4

Figure 19:
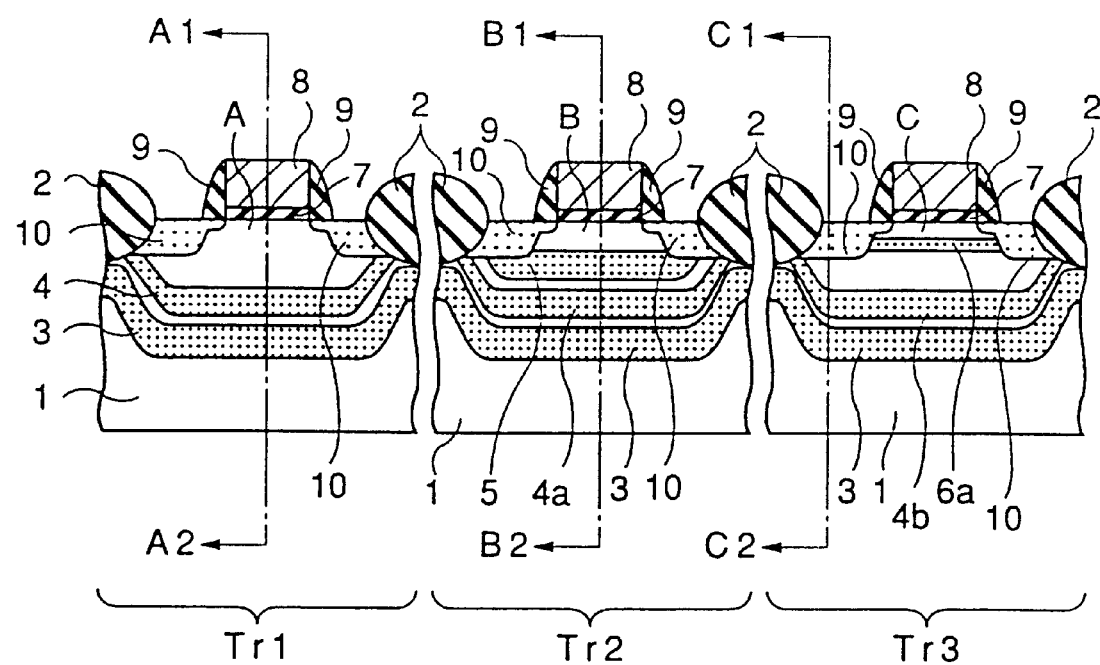
FIG. 19 is a cross section showing a structure of a semiconductor device of an embodiment 4 of the invention.

Similarly to the structure already described in connection with the embodiment 2, indium may be used as the impurity for forming third impurity layer 6a at channel region C of the transistor for memory cell, which should selectively have a relatively high threshold, as shown in FIG. 19 instead of third impurity layer 6 doped with boron.

Figure 20:
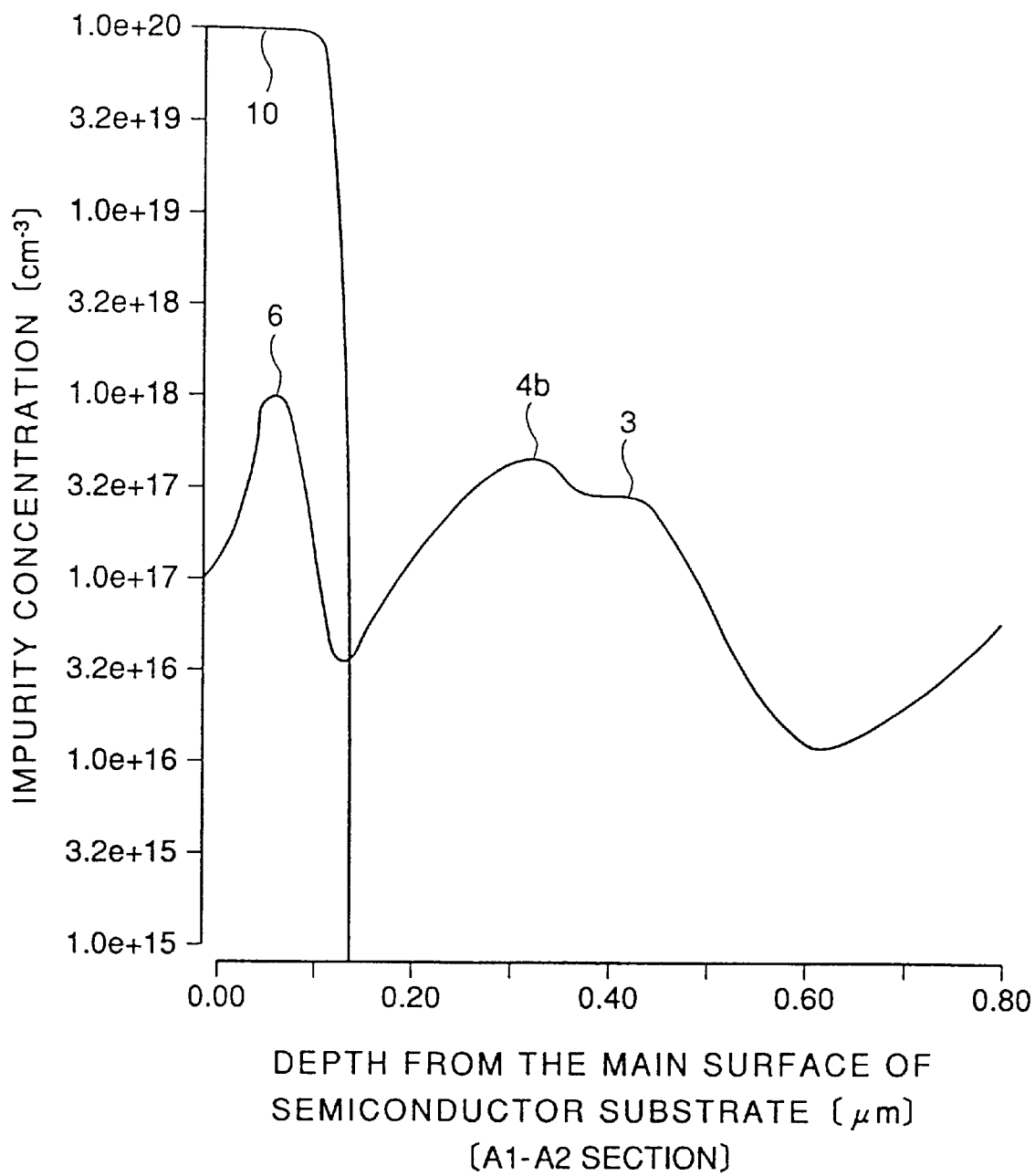
FIG. 20 shows an impurity concentration profile on a section taken along line XX—XX in FIG. 19.

FIG. 20 shows an impurity concentration profile on a section XX—XX extending downward from the main surface of semiconductor substrate 1 through source/drain region 10 in the semiconductor device shown in FIG. 19, which includes third impurity layer 6a doped with indium and located at channel region C of the transistor for memory cell.

In FIG. 20, a steep peak by third impurity layer 6a is found, and then peaks by first impurity layer 4 and heavily doped layer 3 are found, as the position moves in the depth direction from the main surface of semiconductor substrate 1.

A distribution at a relatively high concentration of source/drain region 10, which is a diffusion region of impurity of the opposite conductivity type, expands from the surface of the semiconductor substrate, and forms a junction near the minimum point of the impurity concentration between the peaks by third impurity region 6a and first impurity region 4b. Since the impurity in third impurity layer 6a is indium having a larger mass than boron, a steep peak is formed at the impurity distribution, and such an advantage can be achieved that the impurity concentration at the junction position can be easily restricted to be small even if the peak concentration is large.

The transistor for memory cell can has an improved resistance against punch through and can suppress the junction leakage, while maintaining the same performances of the transistors for sense amplifier and peripheral circuit, as can be done in the semiconductor device of the embodiment 1

Embodiment 5

Figure 21:
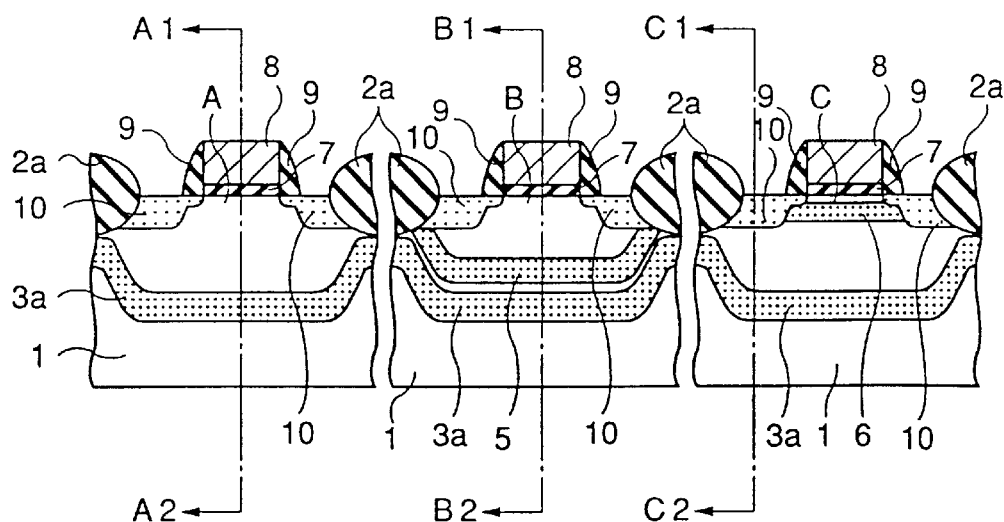
FIG. 21 is a cross section showing a structure of a semiconductor device of an embodiment 5 of the invention.

An embodiment 5 of the invention will be described below. FIG. 21 is a cross section showing a semiconductor device of the embodiment 5, and particularly showing transistors for sense amplifier, peripheral circuit and memory cell which are aligned in this order from the left to the right in the figure. In FIG. 21, 2a indicates an LOCOS isolating oxide film having a thickness of 2300 Å which is smaller than that in the embodiment 1, and 3a, 3b and 3c show heavily doped layers formed at regions forming channel regions of the above transistors, respectively. The same reference numbers and characters as those already used denote the same or corresponding portions.

Figure 22:
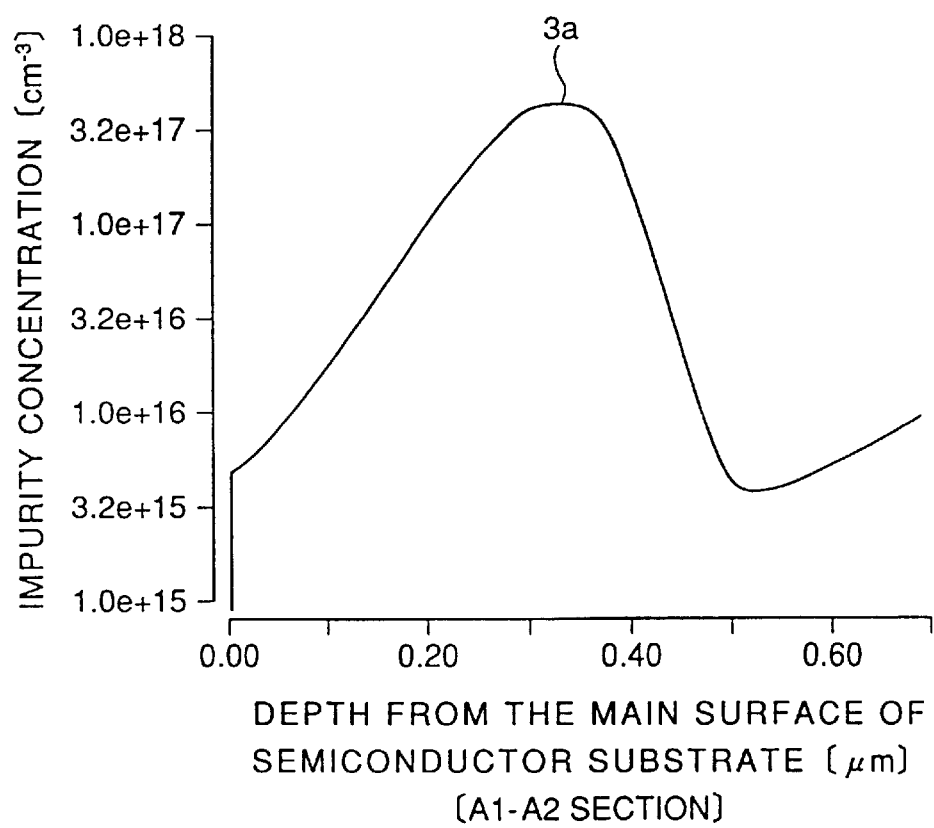
FIG. 22 shows an impurity concentration profile on a section taken along line XXII—XXII in FIG. 21.
Figure 23:
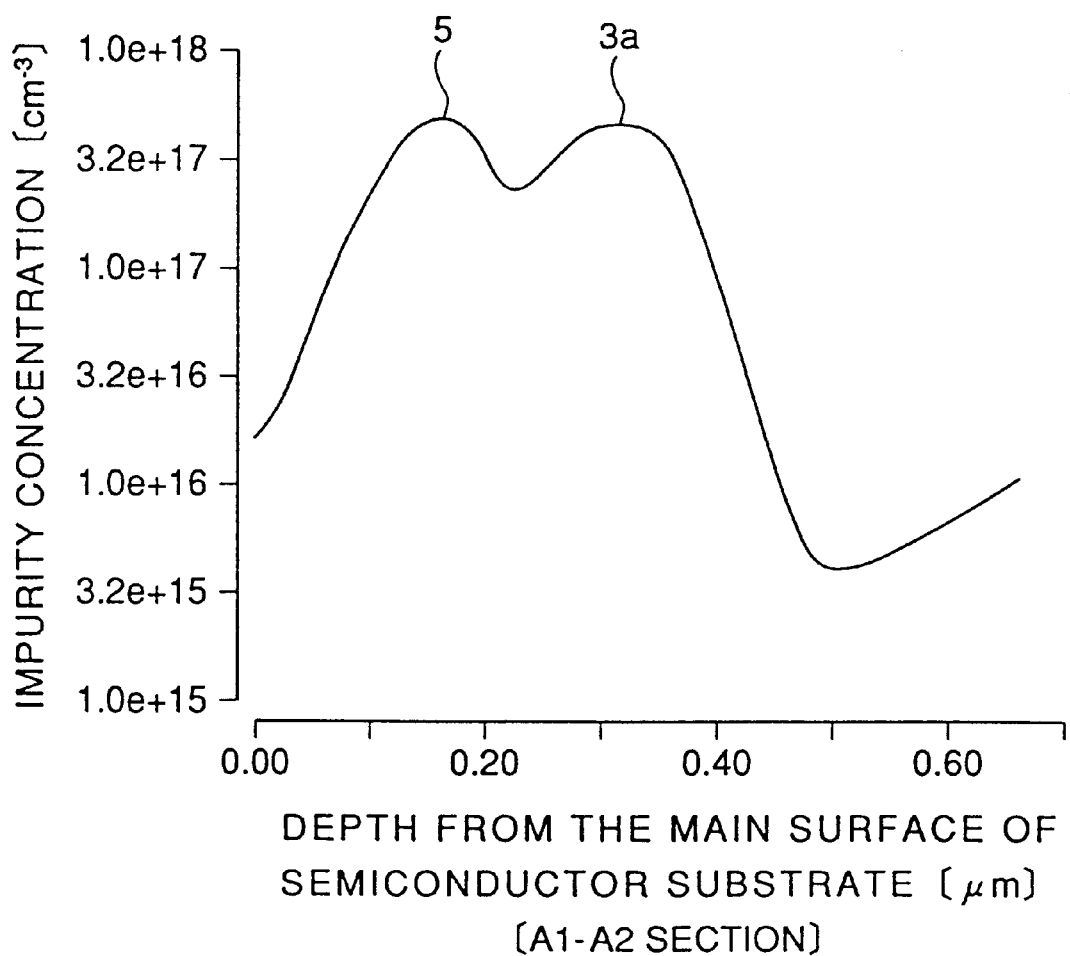
FIG. 23 shows an impurity concentration profile on a section taken along line XXIII—XXIII in FIG. 21.
Figure 24:
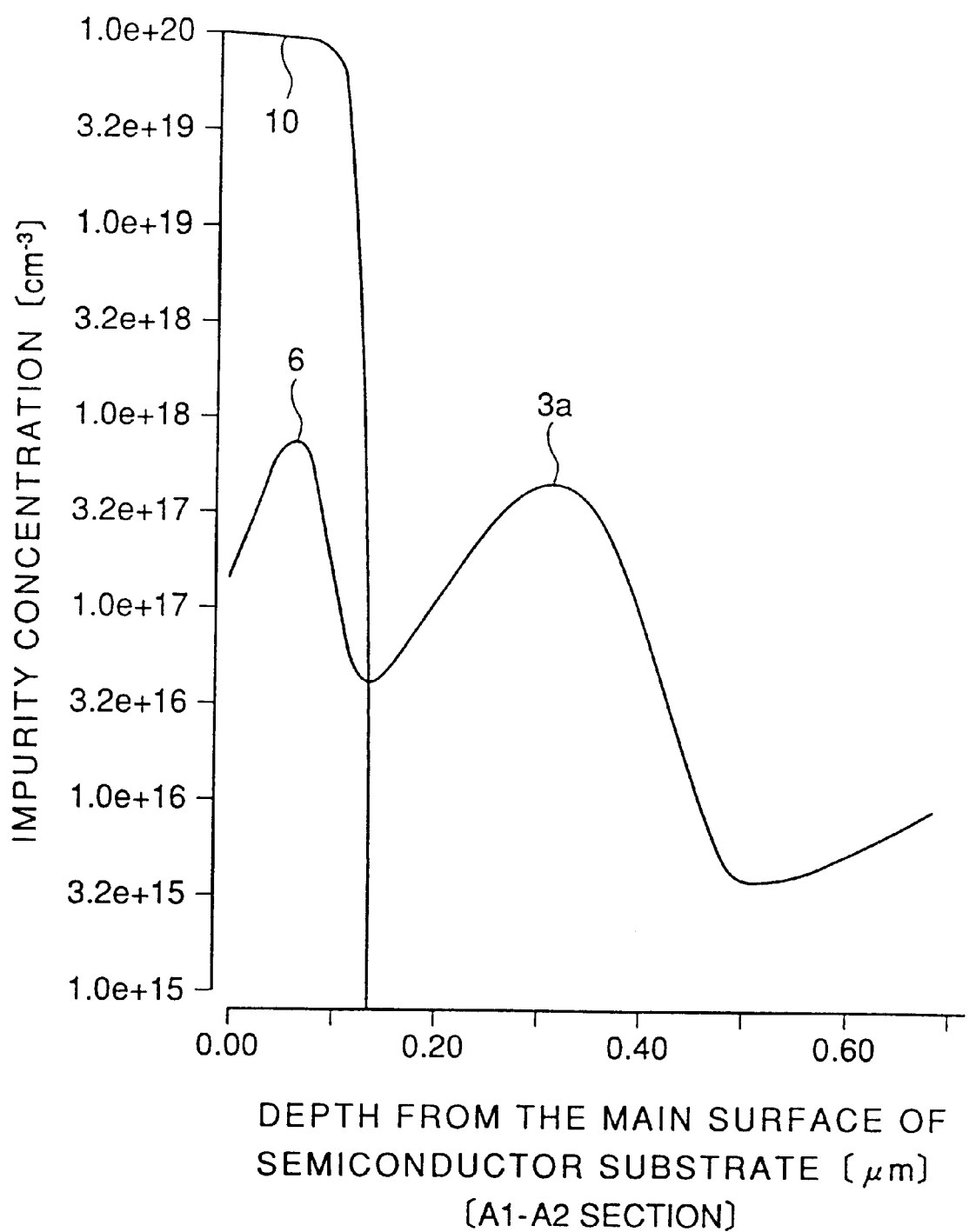
FIG. 24 shows an impurity concentration profile on a section taken along line XXIV—XXIV in FIG. 21.

FIGS. 22, 23 and 24 show impurity profiles on sections XXII—XXII, XXIII—XXIII and XXXIV—XXXIV extending in a depth direction from the main surface of semiconductor substrate 1 in the transistors shown in FIG. 21, respectively. From FIG. 22 showing the impurity concentration profile on the section through channel region A in the transistor for sense amplifier, it is seen that a peak in the impurity concentration profile provided by heavily doped layer 3a is present at a relatively deep position from the surface of semiconductor substrate.

From FIG. 23 showing the impurity concentration profile on the section through channel region B in the transistor for peripheral circuit, it is seen that, in addition to the peak by heavily doped layer 3b similar to that by heavily doped layer 3a shown in FIG. 22, a peak in the impurity concentration profile provided by second impurity layer 5 is present at a shallower position. From FIG. 24 showing the impurity concentration profile on the section through source/drain region 10 in the transistor for memory cell, it is seen that, in addition to the peak by heavily doped layer 3c similar to that by heavily doped layer 3a shown in FIG. 22, a peak in the impurity concentration profile provided by third impurity layer 6 is present at a position shallower than that by second impurity layer 5 in FIG. 23. A junction with respect to source/drain region 10 is formed at a low concentration portion between third impurity layer 6 and heavily doped layer 3c.

Figure 25:
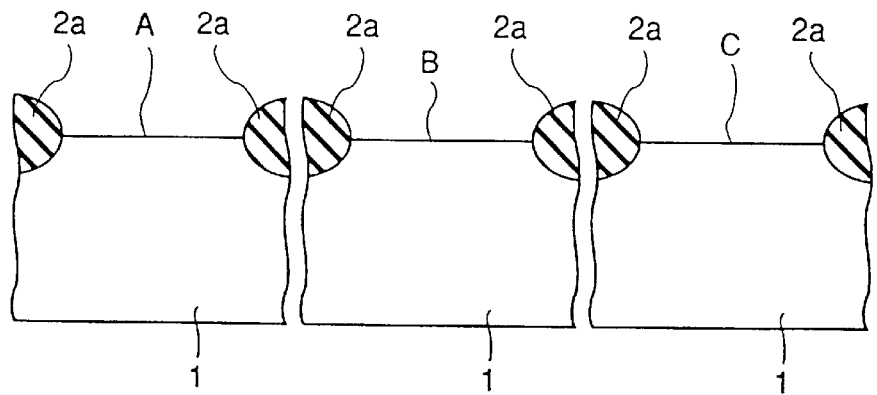
FIGS. 25 to 28 are cross sections showing steps of manufacturing the semiconductor device of the embodiment 5 of the invention, respectively.

Description will now be given on a method of manufacturing the semiconductor device described above. First, as shown in FIG. 25, thick LOCOS isolating and insulating films 2a, which have a thickness of about ¾ of that of LOCOS isolating and insulating film 2 in the embodiments 1 to 4, are formed at regions which will form the active regions at the main surface of P-type semiconductor substrate 1.

Figure 26:
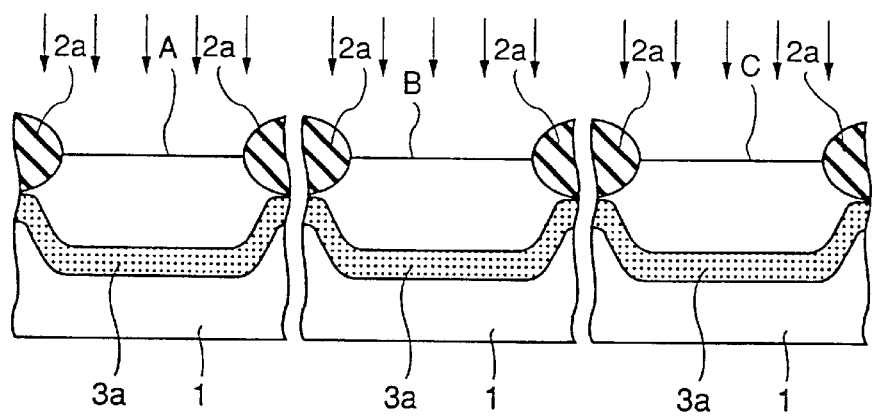

As shown in FIG. 26, impurity such as boron is ion-implanted into the whole surface of regions for forming the N-type transistors in semiconductor substrate 1 under conditions of 300 KeV and 5E12 $cm^{-2}$, whereby wells are formed. As shown in FIG. 26, impurity such as boron is ion-implanted under conditions of 100 KeV and 7E12 $cm^{-2}$ to form heavily doped layers 3 for isolation immediately under LOCOS isolating and insulating films 2a as well as heavily doped layers 3a, 3b and 3c under channel regions A, B and C.

Figure 27:
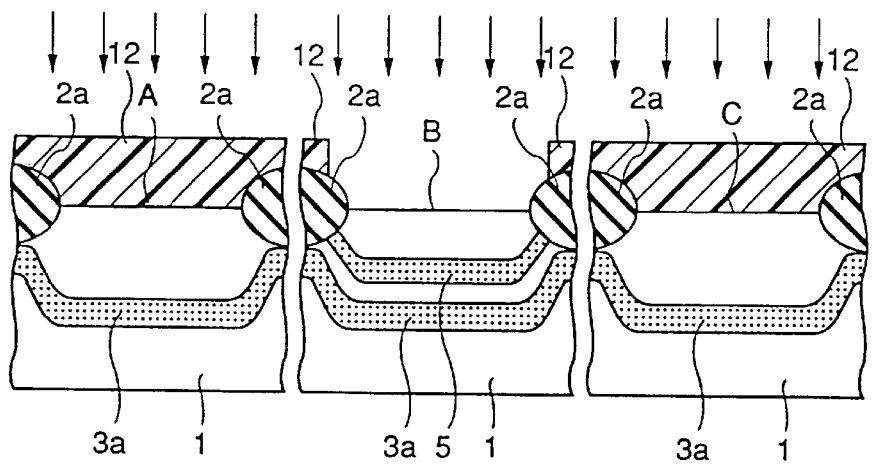

As shown in FIG. 27, resist mask 12 is formed over regions other than the region for forming the N-type transistor for peripheral circuit, and ion implantation of, e.g., boron is performed through resist mask 12 under conditions of 50 KeV and 4E12 $cm^{-2}$ to form second impurity layer 5. Thereafter, resist mask 12 is removed.

Figure 28:
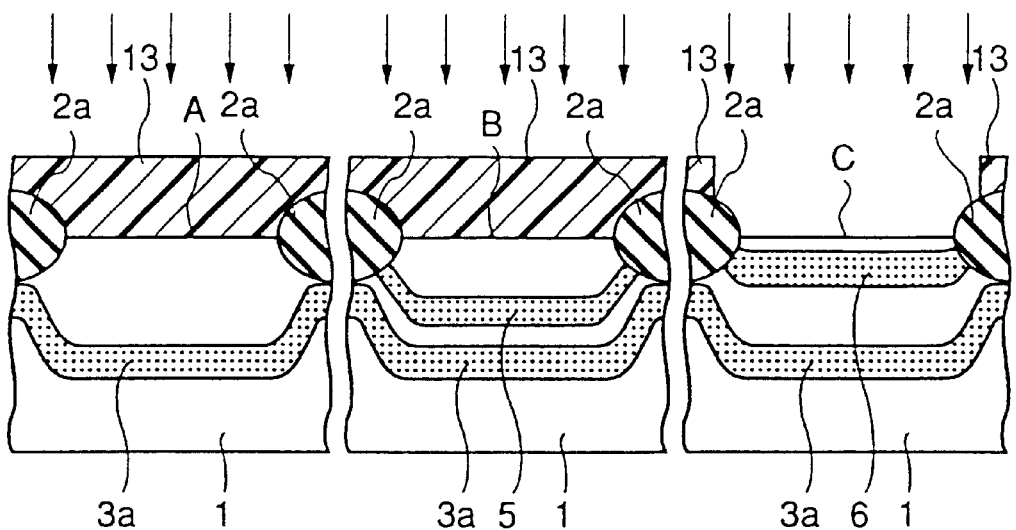

As shown in FIG. 28, resist mask 13 is formed over regions other than the region for forming the N-type transistor for memory cell, and ion implantation of, e.g., boron is performed through resist mask 13 under conditions of 20 KeV and 6E12 $cm^{-2}$ to form third impurity layer 6. Thereafter, resist mask 13 is removed. Subsequently, processing is performed similarly to the other embodiments to form gate insulating films 7, gate electrodes 8, side walls 9 and source/drain regions 10 of the LDD structure, so that the semiconductor device in FIG. 21 is completed. Likewise, P-type transistors may be formed through the same processes as those for the N-type transistors by employing ion species of the opposite conductivity type for impurity implantation.

In the semiconductor device thus formed, since the impurity concentrations as well as depths of peaks in the impurity concentration profiles are controlled in respective channel regions A, B and C of the transistors, characteristics of the transistors for sense amplifier, peripheral circuit and memory cell can be optimized. Further, channel region A in the transistor for sense amplifier is provided with only heavily doped layer 3a, and does not include an additional impurity layer, so that the transistors having optimum characteristics can be manufactured through a small number of manufacturing steps.

Embodiment 6

Figure 29:
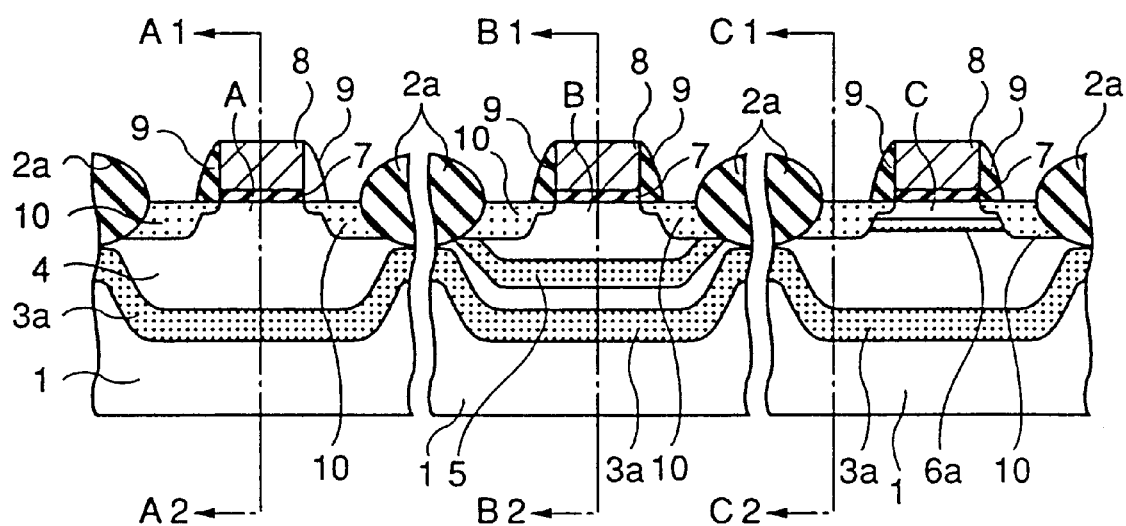
FIG. 29 is a cross section showing a structure of a semiconductor device of an embodiment 6 of the invention.

A semiconductor device of an embodiment 6 of the invention is shown in FIG. 29. The semiconductor device in FIG. 29 is provided with transistors for sense amplifier, peripheral circuit and memory cell which are aligned from the left to the right in the figure.

In contrast to the embodiment 5, in which third impurity layer 6 doped with boron is formed at channel region C in the transistor for memory cell, the semiconductor device of this embodiment 6 has such a distinctive feature that channel region C of the transistor for memory cell transistor is provided with third impurity layer 6a, which is doped with indium having a larger mass than boron and has an impurity concentration profile exhibiting a steep peak not depending on a depth from the main surface of semiconductor substrate. Structures other than the above are similar to those of the embodiment 5.

Figure 30:
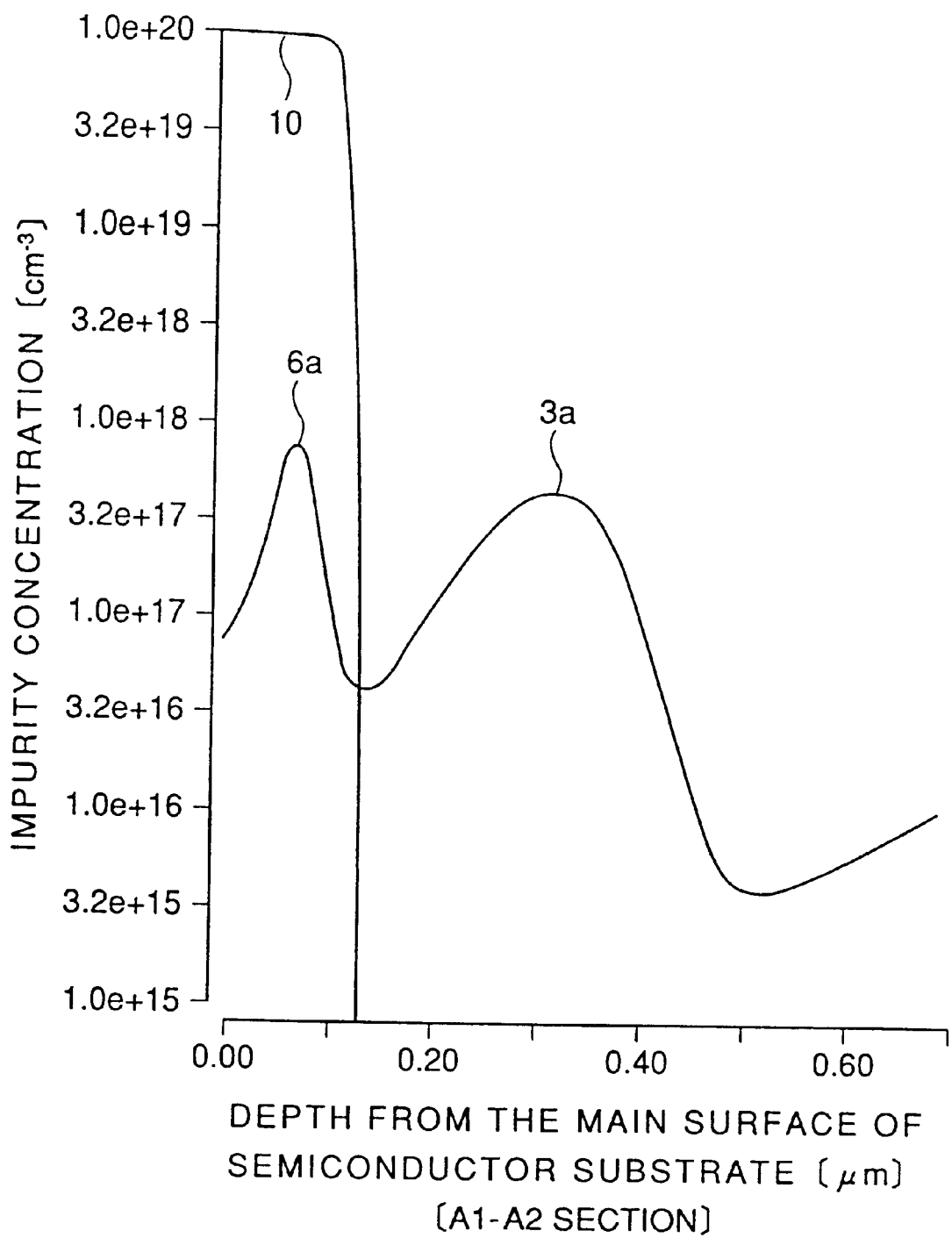
FIG. 30 shows an impurity concentration profile on a section taken along line XXX—XXX in FIG. 29.

FIG. 30 shows an impurity concentration profile on a section XXX—XXX extending downward from the main surface of semiconductor substrate 1 through source/drain region 10 of the transistor for memory cell in the semiconductor device shown in FIG. 29.

In FIG. 30, a peak of impurity concentration provided by third impurity layer 6a is present at a position relatively near the main surface of semiconductor substrate 1, and an impurity concentration peak by heavily doped layer 3a is present at a deeper position.

Figure 31:
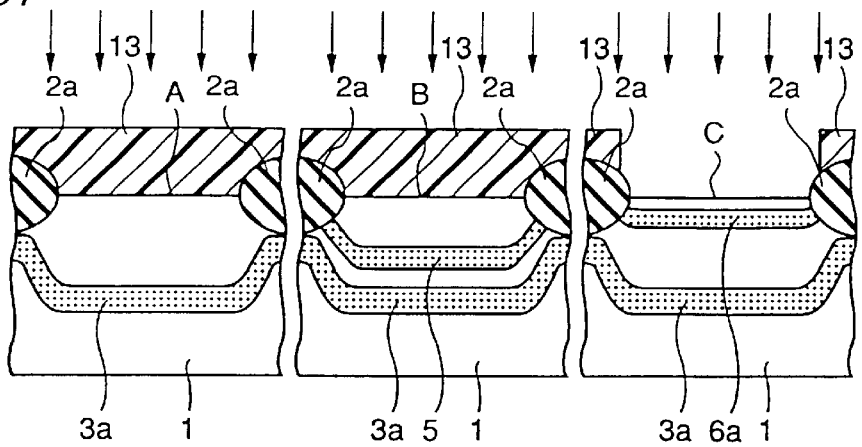
FIG. 31 is a cross section showing a step of manufacturing the semiconductor device of the embodiment 6 of the invention.
Figure 32:
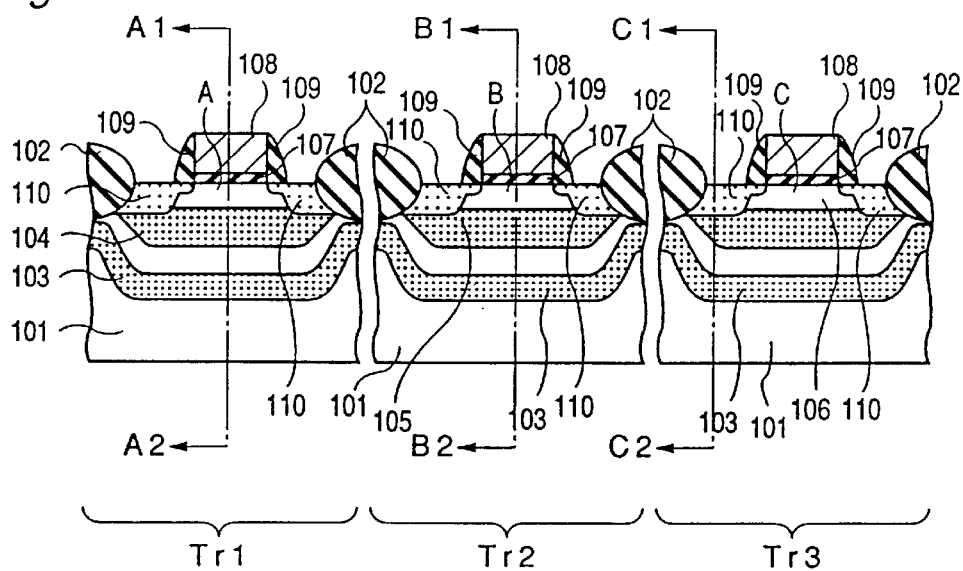
FIG. 32 is a cross section showing a structure of a conventional semiconductor device pertinent to the invention.
Figure 33:
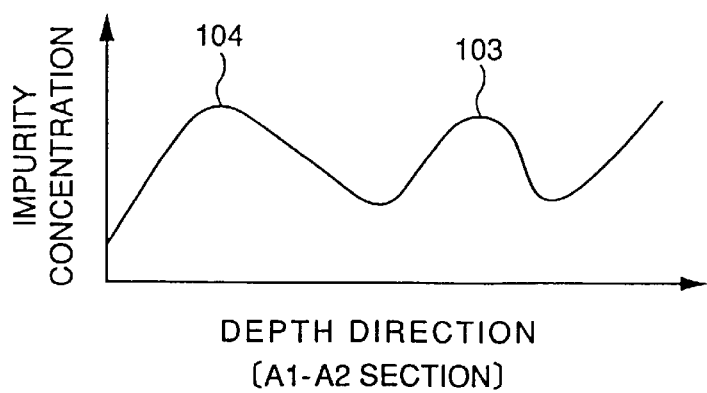
FIG. 33 shows an impurity concentration profile on a section taken along line XXXIII—XXXIII in FIG. 32.
Figure 34:
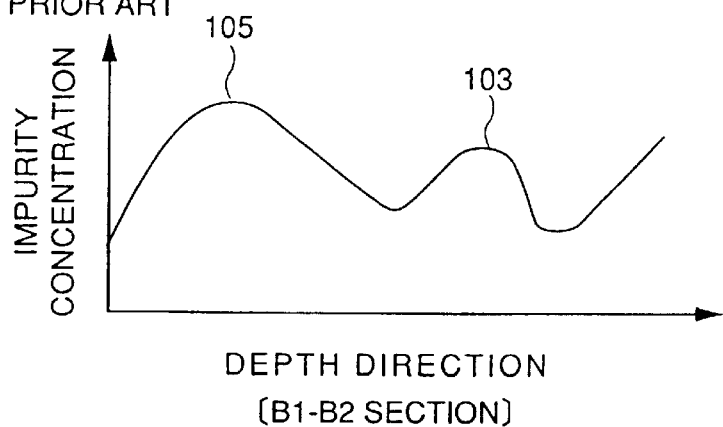
FIG. 34 shows an impurity concentration profile on a section taken along line XXXIV—XXXIV in FIG. 32.
Figure 35:
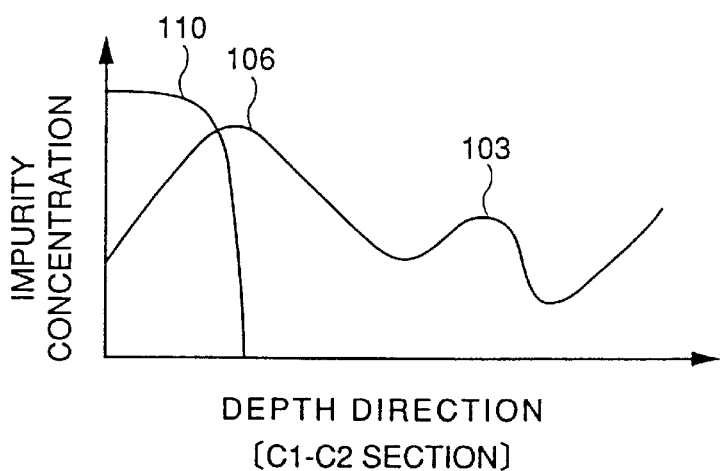
FIG. 35 shows an impurity concentration profile on a section taken along line XXXV—XXXV in FIG. 32.
Figure 36:
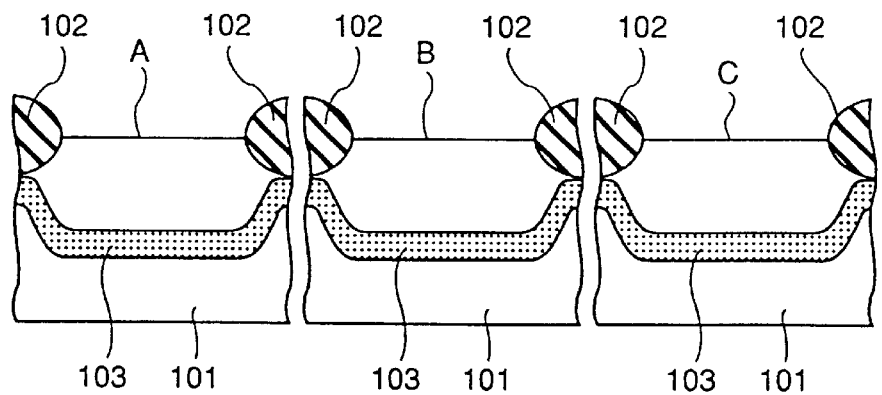
FIGS. 36 to 39 are cross sections showing steps of manufacturing the conventional semiconductor device shown in FIG. 31, respectively.
Figure 37:
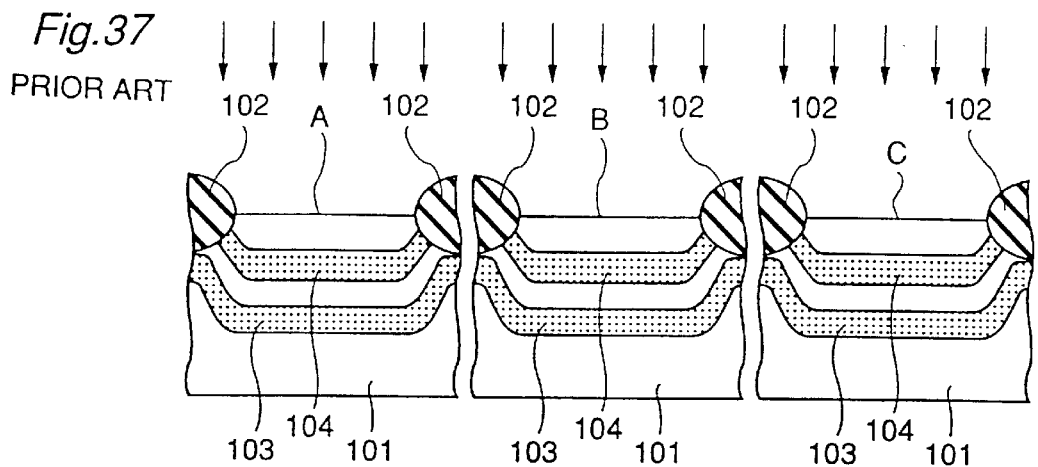
Figure 38:
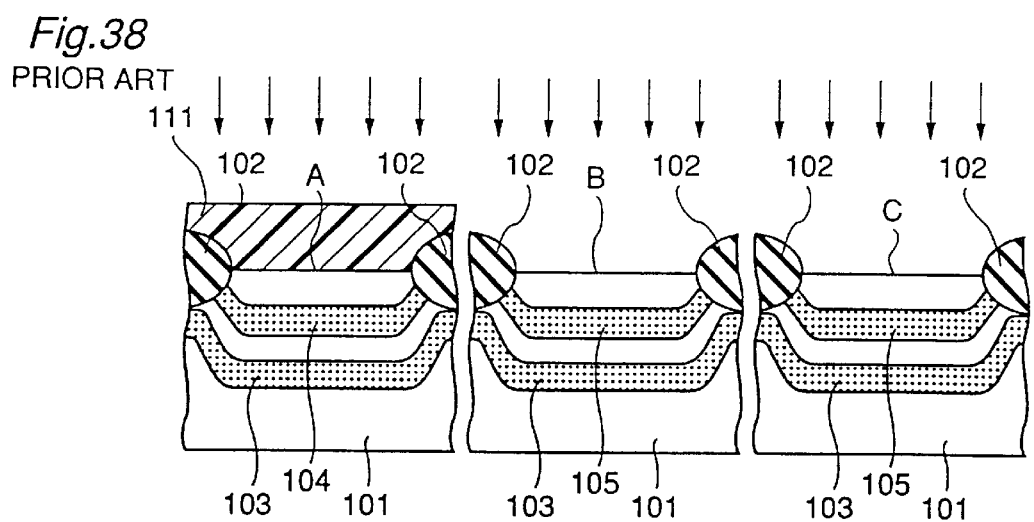
Figure 39:
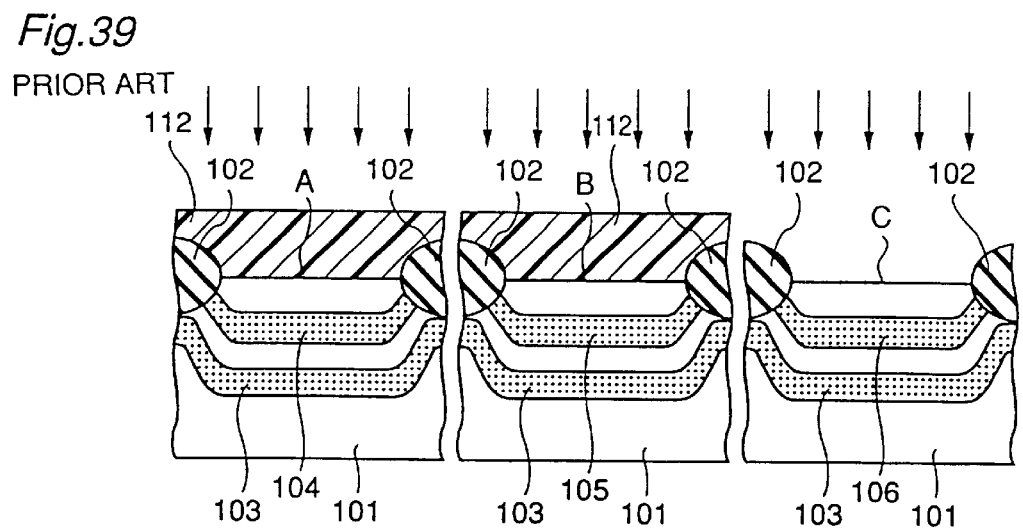

A method of manufacturing the semiconductor device in FIG. 29 will be described below. Similarly to the embodiment 5, processing shown in FIGS. 25 to 27 is performed, and then, as shown in FIG. 31, resist mask 13 is formed over the regions other than the region for forming the memory cell transistor. Through resist mask 13, trivalent ions of, e.g., indium having a larger mass than boron are ion implanted under conditions of 50 KeV and 1E13 $cm^{-2}$ to form third impurity layer 6a.

Thereafter, resist mask 13 is selectively removed, and subsequently processing is performed similarly to the embodiment 5 to form gate insulating films 7, gate electrodes 8, side walls 9 and source/drain regions 10 of the LDD structure, so that the semiconductor device in FIG. 29 is completed. Likewise, P-type transistors may be formed through the same processes as those for the N-type transistors by employing ion species of the opposite conductivity type for ion implantation.

In the semiconductor device thus formed, since trivalent ions of a large mass are implanted into channel region C of the transistor for memory cell, a steep profile can be formed while maintaining a large peak concentration value at the impurity concentration profile, and it is possible to restrict the concentration at a junction between source/drain region 10 and the channel region. Thereby, the transistor for memory cell can has an improved resistance against punch through and can suppress the junction leakage, while maintaining the same performances of the transistors for sense amplifier and peripheral circuit as those of the embodiment 5.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device and particularly forming, at a main surface of a semiconductor substrate, a first MIS transistor with a first threshold voltage having a first channel region and a second MIS transistor with a second threshold voltage having a second channel region, the first and second MIS transistors being of the same conductivity type, the method comprising the steps of:

forming first and second active regions of the same conductivity type at said main surface of said semiconductor substrate for forming said first and second MIS transistors, respectively;

forming said first channel region having a first impurity layer by implanting first conductivity type ions with a predetermined ion implanting energy into a region for said first channel region in said first active region;

forming said second channel region having a second impurity layer by implanting first conductivity type ions with an ion implanting energy different from said predetermined ion implanting energy into a region for said second channel region in said second active region;

forming a gate insulating film on said first and second channel regions;

forming gate electrodes on said first and second channel regions with said gate insulating film therebetween, respectively; and forming source/drain regions of a conductivity type opposite the first conductivity type at positions in said main surface located at opposite sides of each of said first and second channel regions.

2. The method of manufacturing the semiconductor device according to claim 1, wherein said step of forming said first channel region includes the step of forming said first impurity layer by performing ion-implantation selectively on said first channel region with a first ion implanting energy; and said step of forming said second channel region includes the step of forming said second impurity layer by performing ion implantation selectively on said second channel region with a second ion implanting energy.

3. The method of manufacturing the semiconductor device according to claim 1, wherein said ion implantation in said step of forming said second channel region is performed by implantation of ions of ion species different from those used for said ion implantation in the step of forming said first channel region.

4. A method of manufacturing a semiconductor device and particularly forming, at a main surface of a semiconductor substrate, a first MIS transistor having a first channel region and a second MIS transistor having a first channel region and a second MIS transistor having a second channel region, the first and second transistors being of the same conductivity type, the method comprising the steps of:

forming, at said main surface of said semiconductor substrate, first and second active regions of the same conductivity type for forming said first and second MIS transistors, respectively;

forming first and second heavily doped layers by effecting ion implantation with a predetermined ion implanting energy on regions for said first and second channel regions in said first and second active regions, respectively;

forming, at a region for said second channel region in said second active region, an impurity layer located between a position for forming said second heavily doped layer and said main surface;

forming a gate insulating film on said first and second channel regions;

forming gate electrodes on said first and second channel regions with said gate insulating film therebetween; and forming source/drain regions at positions in said main surface located at opposite sides of each of said first and second channel regions.

5. The method according to claim 1, comprising forming the second channel region by ion implanting the first conductivity type ions with an ion implanting energy less than said predetermined ion implanting energy used in forming the first channel region.

6. The method according to claim 5, wherein the second threshold voltage is greater than the first threshold voltage.

* * * * *